(12) United States Patent
Hara et al.

(10) Patent No.: US 9,203,377 B2
(45) Date of Patent: Dec. 1, 2015

(54) DUPLEXER

(71) Applicant: TAIYO YUDEN CO., LTD., Tokyo (JP)

(72) Inventors: Motoaki Hara, Miyagi (JP); Shogo Inoue, Tokyo (JP); Masafumi Iwaki, Tokyo (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 188 days.

(21) Appl. No.: 13/759,385

(22) Filed: Feb. 5, 2013

(65) Prior Publication Data

US 2013/0147578 A1    Jun. 13, 2013

Related U.S. Application Data

(63) Continuation of application No. PCT/JP2011/058926, filed on Apr. 8, 2011.

(30) Foreign Application Priority Data

Oct. 18, 2010  (JP) .................................. 2010-233640

(51) Int. Cl.
*H03H 9/70*  (2006.01)
*H03H 9/02*  (2006.01)
(Continued)

(52) U.S. Cl.
CPC .............. *H03H 9/70* (2013.01); *H03H 9/02015* (2013.01); *H03H 9/173* (2013.01); *H03H 9/175* (2013.01); *H03H 9/605* (2013.01); *H03H 9/706* (2013.01); *H03H 9/132* (2013.01); *H04B 1/0057* (2013.01)

(58) Field of Classification Search
CPC .......... H03H 9/02015; H03H 9/02062; H03H 9/02118; H03H 9/568; H03H 9/605; H03H 9/706; H03H 9/70; H03H 9/173; H03H 9/175; H03H 9/132; H04B 1/0057
USPC ........................................................ 333/133
See application file for complete search history.

(56) References Cited

U.S. PATENT DOCUMENTS 6,243,933 B1 *  6/2001  Sugimoto et al. ............ 29/25.35
6,262,637 B1    7/2001  Bradley et al.
(Continued)

FOREIGN PATENT DOCUMENTS

JP    2001-024476 A    1/2001
JP    2005-159402 A    6/2005
(Continued)

OTHER PUBLICATIONS

English translation of Written Opinion (PCT/ISA/237) issued in PCT/JP2011/058926 mailed in Jun. 2011.
(Continued)

*Primary Examiner* — Barbara Summons
(74) *Attorney, Agent, or Firm* — Chen Yoshimura LLP

(57) ABSTRACT

A duplexer includes: a first filter of which first and second ends connect to a common terminal and a first terminal respectively; and a second filter having a passband higher than that of the first filter, a first end and second end thereof connecting to the common terminal and a second terminal respectively, wherein a phase shifter is located neither between the first filter and the common terminal nor between the second filter and the common terminal, the second filter is a ladder-type filter including piezoelectric thin film resonators connected in a ladder shape, a propagation constant in a direction perpendicular to a thickness direction of a piezoelectric thin film in the piezoelectric thin film resonator is a real number at frequencies lower than a resonance frequency of the piezoelectric thin film resonator, and a resonator at a first stage is a parallel resonator in the second filter.

17 Claims, 36 Drawing Sheets

(51) Int. Cl.
  *H03H 9/60* (2006.01)
  *H03H 9/17* (2006.01)
  *H04B 1/00* (2006.01)
  *H03H 9/13* (2006.01)

(56) References Cited

U.S. PATENT DOCUMENTS

| | | | |
|---|---|---|---|
| 7,126,440 B2 * | 10/2006 | Bradley et al. | 333/133 |
| 7,961,066 B2 * | 6/2011 | Heinze et al. | 333/189 |
| 8,279,021 B2 * | 10/2012 | Hara et al. | 333/133 |
| 8,854,156 B2 * | 10/2014 | Iwashita et al. | 333/187 |
| 2006/0066419 A1 | 3/2006 | Iwaki et al. | |
| 2007/0080756 A1 * | 4/2007 | Aigner et al. | 333/133 |
| 2007/0111674 A1 | 5/2007 | Iwamoto et al. | |
| 2008/0051039 A1 | 2/2008 | Iwasaki et al. | |
| 2008/0055021 A1 | 3/2008 | Ueda et al. | |
| 2008/0179995 A1 | 7/2008 | Umeda et al. | |
| 2009/0273408 A1 * | 11/2009 | Inoue et al. | 333/4 |
| 2010/0156565 A1 * | 6/2010 | Oka et al. | 333/187 |
| 2011/0018654 A1 * | 1/2011 | Bradley et al. | 333/133 |
| 2012/0182087 A1 * | 7/2012 | Ye et al. | 333/133 |

FOREIGN PATENT DOCUMENTS

| | | |
|---|---|---|
| JP | 2006-129445 A | 5/2006 |
| JP | 2007-142560 A | 6/2007 |
| JP | 2008-079294 A | 4/2008 |
| JP | 2008-085989 A | 4/2008 |
| WO | 2007/052370 A1 | 5/2007 |
| WO | WO 2010/095640  * | 8/2010 |

OTHER PUBLICATIONS

International Search Report (ISR) issued in PCT/JP02011/058926 mailed in Jun. 2011.

Written Opinion (PCT/ISA/237) issued in PCT/JP02011/058926 mailed in Jun. 2011.

* cited by examiner

DUPLEXER

CROSS-REFERENCE TO RELATED APPLICATION

This application is a continuation of and claims priority to International Patent Application No. PCT/JP2011/058926 filed Apr. 8, 2011, which claims priority to Japanese Patent Application No. 2010-233640 filed on Oct. 18, 2010, subject matter of these patent documents is incorporated by reference herein in its entirety.

FIELD

A certain aspect of the present invention relates to duplexers.

BACKGROUND

In recent years, mobile communication devices such as mobile phones and mobile information terminals have rapidly spread. Duplexers, especially, high-frequency duplexers are used in mobile communication devices to prevent reception and transmission signals from interfering with each other. A duplexer is commonly composed of a transmission filter and a reception filter as a package to downsize the mobile communication devices. A ladder-type filter may be used as a low-loss filter constituting the duplexer. The ladder-type filter is a filter formed by connecting a serial arm and a parallel arm, each having resonators. A surface acoustic wave (SAW) resonator, or a piezoelectric thin film resonator may be used as the resonator. The piezoelectric thin film resonator does not use a fine pattern such as a comb-shaped electrode included in the SAW resonator, and thus is suitable especially for a high frequency device that supports frequencies greater than or equal to 1 GHz.

The transmission filter and a reception filter constituting the duplexer are required to have matched impedance so as to have high impedance in the other's passband. When the passband of the reception filter is close to the passband of the transmission filter, impedance matching is especially important. A phase shifter may be used for impedance matching. Japanese Patent Application Publication No. 2006-129445 discloses the invention that provides a phase shifter for impedance matching and a filter in a single package.

Insertion of the phase shifter may cause loss of signal. To prevent loss of signal by the phase shifter, impedance matching may be performed without using the phase shifter. However, when impedance matching is performed without using the phase shifter, a ripple may occur in pass characteristics of the filter.

SUMMARY OF THE INVENTION

According to an aspect of the present invention, there is provided a duplexer including: a first filter of which a first end is coupled to a common terminal, and a second end is coupled to a first terminal; and a second filter having a passband higher than a passband of the first filter, a first end of the second filter being coupled to the common terminal, and a second end being coupled to a second terminal, wherein a phase shifter is located neither between the first filter and the common terminal nor between the second filter and the common terminal, the second filter is a ladder-type filter including piezoelectric thin film resonators connected in a ladder shape, a propagation constant in a direction perpendicular to a thickness direction of a piezoelectric thin film included in the piezoelectric thin film resonator is a real number at frequencies lower than a resonance frequency of the piezoelectric thin film resonator, and a resonator at a first stage as viewed from a side of the common terminal is a parallel resonator in the second filter.

DETAILED DESCRIPTION

Figure 1A:
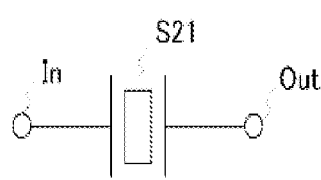
FIG. 1A is a configuration diagram of a series resonator.
Figure 1B:
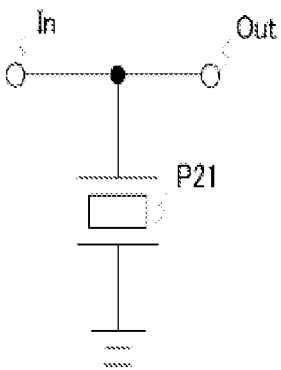
FIG. 1B is a configuration diagram of a parallel resonator.
Figure 1C:
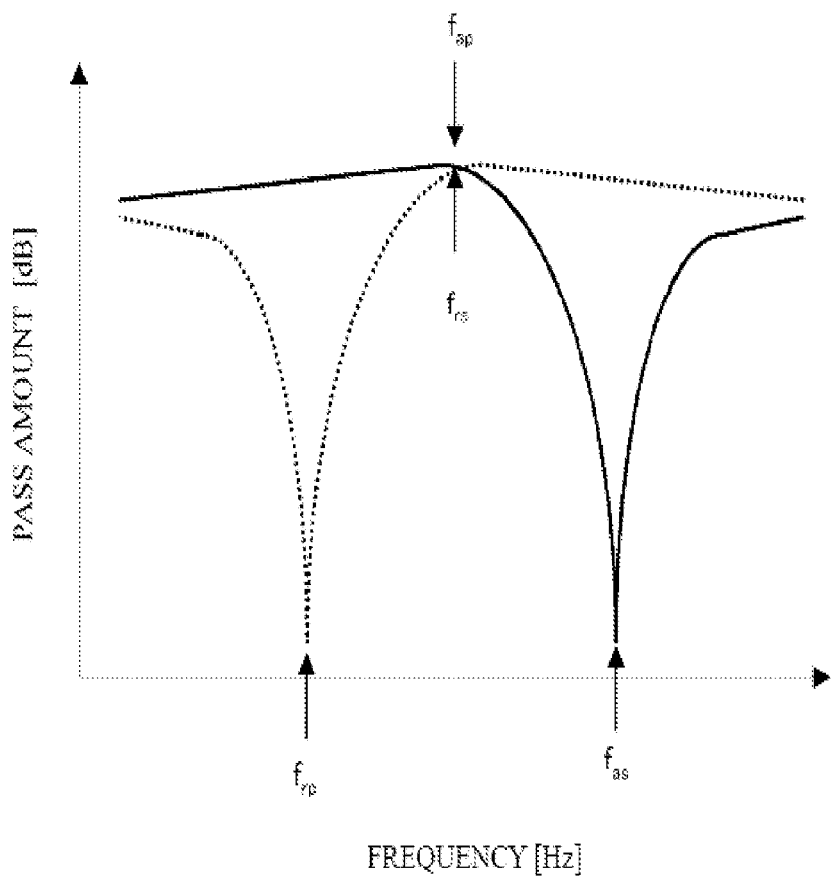
FIG. 1C is a diagram illustrating pass characteristics of the series resonator and the parallel resonator.

First, a description will be given of a ladder-type filter. FIG. 1A is a configuration diagram of a series resonator, FIG. 1B is a configuration diagram of a parallel resonator, and FIG. 1C is a diagram illustrating pass characteristics of the series resonator and the parallel resonator.

Figure 2A:
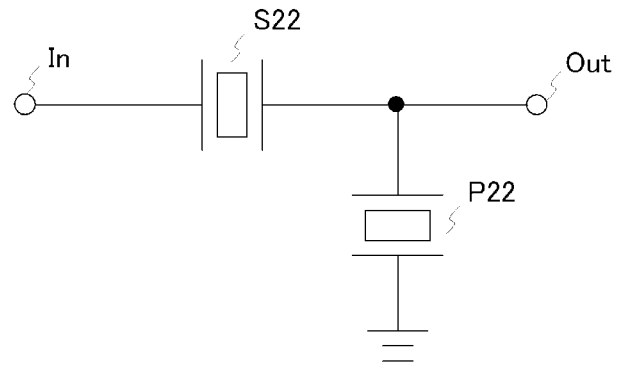
FIG. 2A is a configuration diagram of a one-stage ladder-type filter.
Figure 2B:
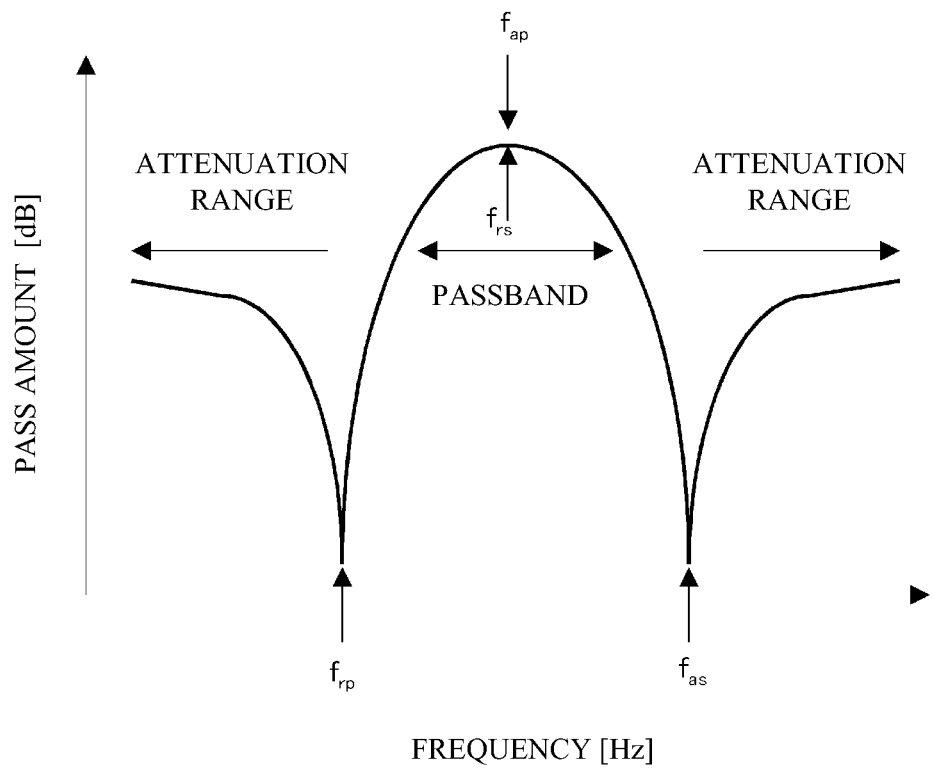
FIG. 2B is a diagram illustrating pass characteristics of the one-stage ladder-type filter.

FIG. 2A is a configuration diagram of a one-stage ladder-type filter, and FIG. 2B is a diagram illustrating pass characteristics of the one-stage ladder-type filter. A frequency range between a resonance point $f_{rp}$ of the parallel resonator and an anti-resonance point $f_{as}$ of the series resonator forms a passband, and a frequency range lower than or equal to the resonance point $f_{rp}$ of the parallel resonator and a frequency range higher than or equal to the anti-resonance point $f_{as}$ of the series resonator form attenuation ranges. Accordingly, the ladder-type filter functions as a bandpass filter.

Figure 3A:
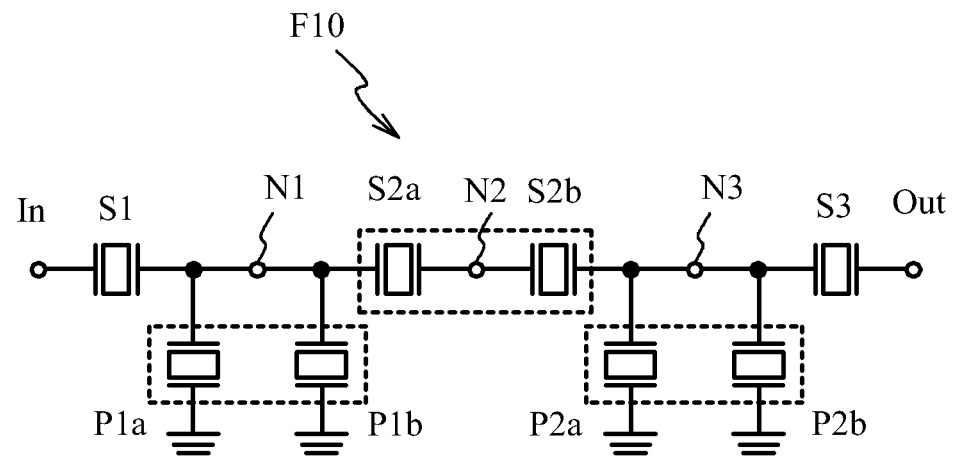
FIG. 3A and FIG. 3B are configuration diagrams of a multi-stage ladder-type filter.
Figure 3B:
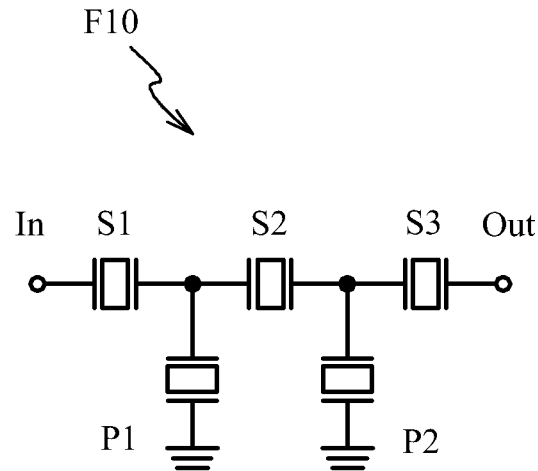

A description will now be given of a multi-stage ladder-type filter. FIG. 3A and FIG. 3B are configuration diagrams of a multi-stage ladder-type filter.

As illustrated in FIG. 3B, to downsize the filter, series resonators S2a and S2b may be replaced with a single series resonator S2. Moreover, parallel resonators P1a and P1b may be replaced with a single parallel resonator P1, and furthermore, parallel resonators P2a and P2b may be replaced with a single parallel resonator P2. As described above, components surrounded by dotted lines in FIG. 3A may be combined into a single component. As described later, the series resonator and the parallel resonator function as capacitors at frequencies outside the passband of the filter. The series resonator S2 has a capacitance equal to the serially-combined capacitance of the series resonator S2a and the series resonator S2b. The parallel resonator P1 has a capacitance equal to the parallel-combined capacitance of the parallel resonator P1a and the parallel resonator P1b. The parallel resonator P2 has a capacitance equal to the parallel-combined capacitance of the parallel resonator P2a and the parallel resonator P2b.

As described above, the multi-stage ladder-type filter has a structure having one-stage ladder-type filters, each connected to another. The number of stages of the ladder-type filter is increased by adding a one-stage ladder-type filter. The one-stage ladder-type filters included in the ladder-type filter have the same capacitance as that of the one-stage ladder-type filter to be added. Therefore, the number of stages of the ladder-type filter affects the degree of suppression, but does not affect the phase of reflection characteristics. In addition, a capacitance ratio Cp/Cs does not affect the phase of the reflection characteristics. The capacitance ratio Cp/Cs and the number of stages affect the degree of suppression of the filter.

Figure 4:
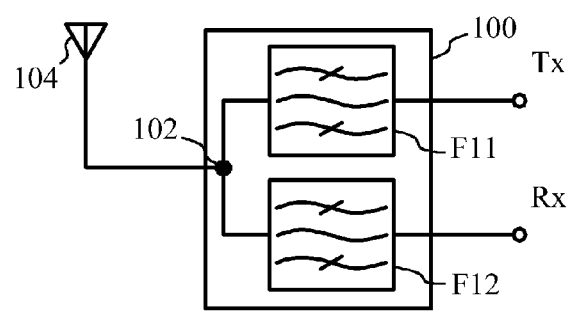
FIG. 4 is a block diagram illustrating a duplexer.

A description will now be given of a configuration of a duplexer. FIG. 4 is a block diagram illustrating a duplexer. As illustrated in FIG. 4, a duplexer 100 includes a transmission filter F11 and a reception filter F12. First ends of the transmission filter F11 and reception filter F12 are connected to an antenna terminal (common terminal) 102. A second end of the transmission filter F11 is connected to a transmission terminal Tx. A second end of the reception filter F12 is connected to a reception terminal Rx. The antenna terminal 102 is connected to an antenna 104. The reception filter F12 receives signals from the antenna 104. The reception filter F12 passes signals having a frequency within a passband out of the received signals and outputs them to the reception terminal Rx. In addition, the reception filter F12 suppresses signals having a frequency outside the passband. The antenna 104 transmits signals transmitted through the transmission filter F11. The transmission filter F11 suppresses signals having a frequency outside the passband. A configuration of the filter will be described later.

Figure 5A:
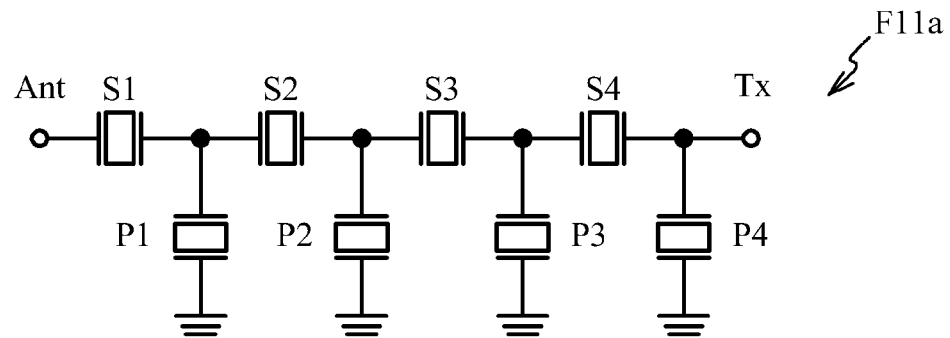
FIG. 5A is a circuit diagram illustrating a ladder-type filter having a series resonator at a first stage.

Next, a description will be given of a comparative example. The comparative example uses a ladder-type filter for a transmission filter and a reception filter in the duplexer illustrated in FIG. 4. The transmission filter and the reception filter included in the duplexer are seven-stage ladder-type filters, and adjoining series resonators and adjoining parallel resonators are combined as illustrated in FIG. 3A and FIG. 3B. A description is first given of a configuration of the transmission filter. FIG. 5A is a circuit diagram illustrating the transmission filter having a series resonator at a first stage. The transmission filter F11a is a seven-stage ladder-type filter. A resonator at the first stage is a series resonator S1 as viewed from the antenna terminal Ant side. Each resonator is a piezoelectric thin film resonator.

Figure 5B:
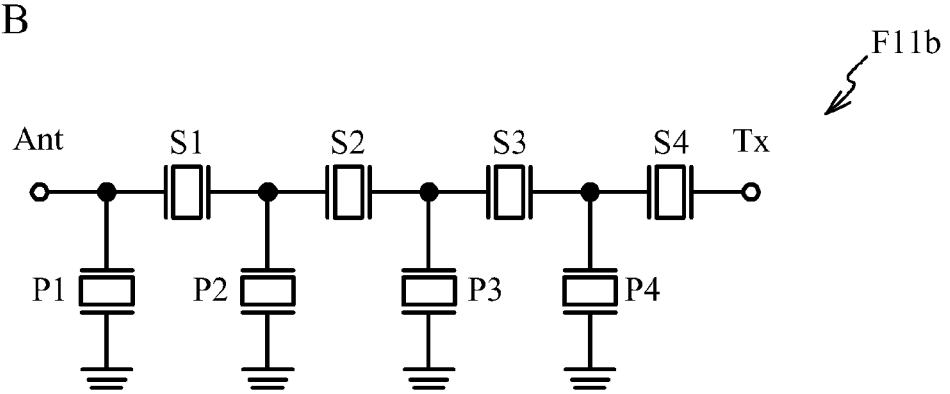
FIG. 5B is a circuit diagram illustrating a ladder-type filter having a parallel resonator at the first stage.

An arrangement of resonators in the transmission filter may differ from that in the above transmission filter F11a. FIG. 5B is a circuit diagram illustrating a transmission filter having a parallel resonator at the first stage.

A transmission filter F11b is a seven-stage ladder-type filter. The resonator at the first stage is a parallel resonator P1 as viewed from the antenna terminal Ant side. Each resonator is a piezoelectric thin film resonator.

A description will be given of simulations that calculate characteristics of the transmission filter and the reception filter. The duplexer is assumed to be a duplexer supporting W-CDMA (Wideband Code Division Multiple Access) Band 2. The transmission band of W-CDMA Band 2 is 1850 to 1910 MHz, and the reception band is 1930 to 1990 MHz. The passband of the transmission filter overlaps the transmission band, and the passband of the reception filter overlaps the reception band.

A description will now be given of resonators included in the filter. Series resonators S1 through S4 have the same resonance frequency, and parallel resonators P1 through P4 have the same resonance frequency. The antenna terminal Ant and the transmission terminal Tx are impedance matched at 50Ω. The following presents capacitances of the resonators included in the transmission filter F11a.

Capacitance of the series resonator S1 in the transmission filter F11a: Cs
Capacitances of the series resonators S2 through S4 in the transmission filter F11a: 0.5Cs
Capacitances of the parallel resonators P1 through P3 in the transmission filter F11a: 2 Cp
Capacitance of the parallel resonator P4 in the transmission filter F11a: Cp
Capacitance ratio: Cp/Cs=0.6

The transmission filter F11a illustrated in FIG. 5A is a filter formed by connecting one-stage ladder-type filters and combining resonators as described in FIG. 3A and FIG. 3B. Each of the series resonators S2 through S4 is a resonator formed by serially combining two series resonators. Therefore, each of the series resonators S2 through S4 has a capacitance of 0.5Cs calculated by serially combining two capacitances Cs. Each of the parallel resonators P1 through P3 is a resonator formed by parallel combining two parallel resonators. Therefore, each of the parallel resonators P1 through P3 has a capacitance of 2 Cp calculated by parallel combining two capacitances Cp.

The following presents capacitances of the resonators included in the transmission filter F11b.

Capacitances of the series resonators S1 through S3 in the transmission filter F11b: 0.5Cs
Capacitance of the series resonator S4 in the transmission filter F11b: Cs
Capacitance of the parallel resonator P1 of the transmission filter F11b: Cp
Capacitances of the parallel resonators P2 through P4 in the transmission filter F11b: 2 Cp Each of the series resonators S1 through S3 is a resonator formed by serially combining two series resonators. Therefore, each of the series resonators S1 through S3 has a capacitance of 0.5Cs calculated by serially combining two capacitances Cs. In addition, each of the parallel resonators P2 through P4 is a resonator formed by parallel combining two parallel resonators. Therefore, each of the parallel resonators P2 through P4 has a capacitance value of 2 Cp calculated by parallel combining two capacitances Cp.

Figure 5C:
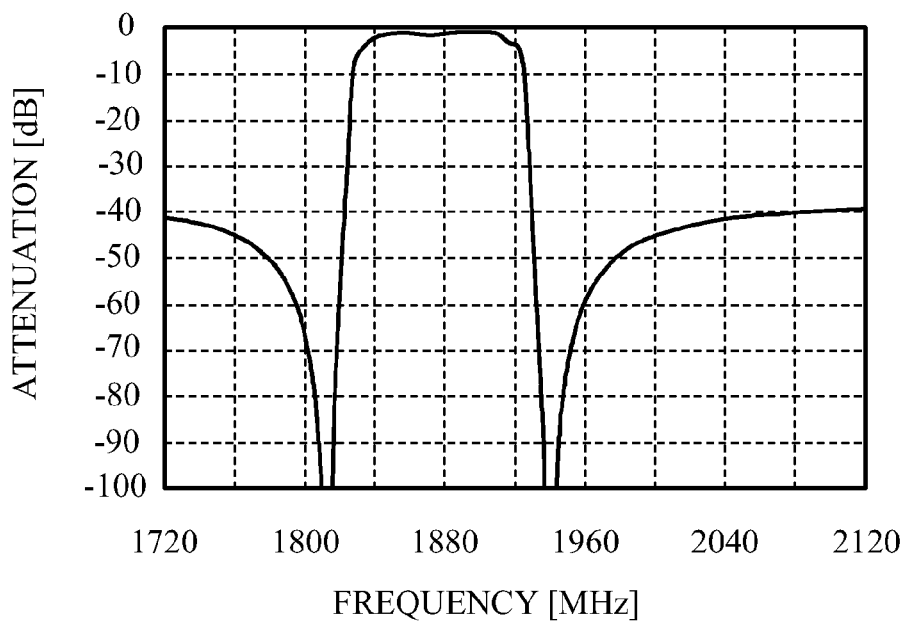
FIG. 5C is a diagram illustrating calculation results of pass characteristics of a transmission filter.

FIG. 5C is a diagram illustrating calculation results of pass characteristics of the transmission filter. A horizontal axis represents frequency, and a vertical axis represents attenuation. The filter used for calculation is one of the transmission filter F11a and the transmission filter F11b illustrated in FIG. 5A. The transmission filter F11a and the transmission filter F11b have mutually reversed arrangements of the antenna terminal Ant, the transmission terminal Tx, and the reception terminal Rx, and thus have the same pass characteristics. As illustrated in FIG. 5C, signals are transmitted within 1850 to 1910 MHz, i.e. within the passband, and signals are suppressed outside the passband. As described above, the passband of the transmission filter F11a and the passband of the transmission filter F11b are located in the transmission band of W-CDMA Band 2.

Figure 6A:
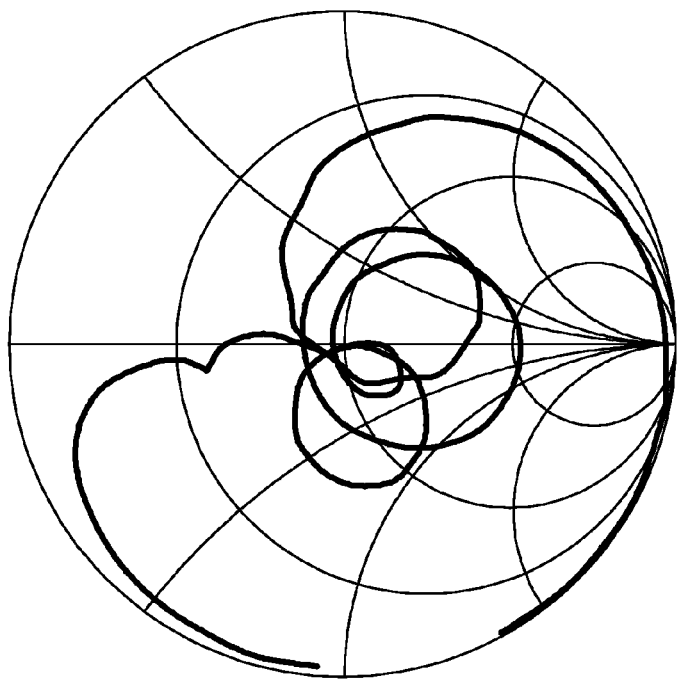
FIG. 6A and FIG. 6B are Smith charts illustrating calculation results of reflection characteristics of a transmission filter included in a duplexer in accordance with a comparative example.
Figure 6B:
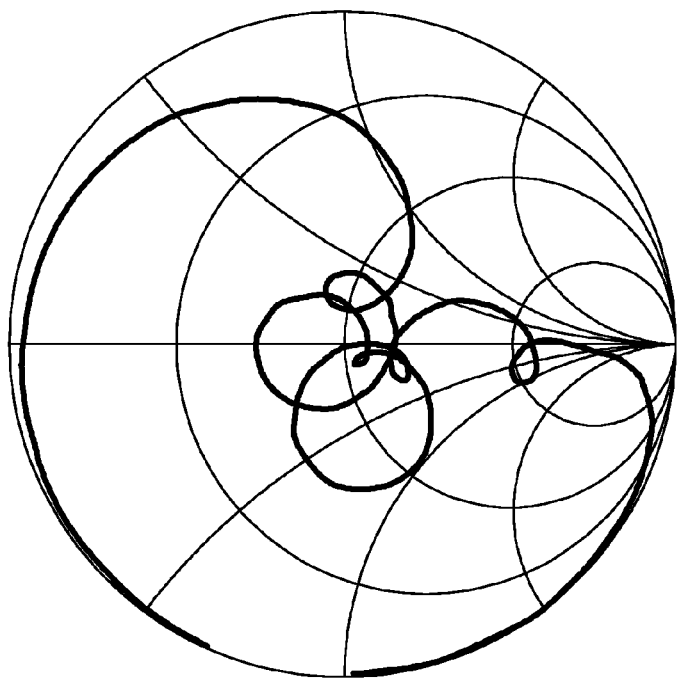
Figure 7A:
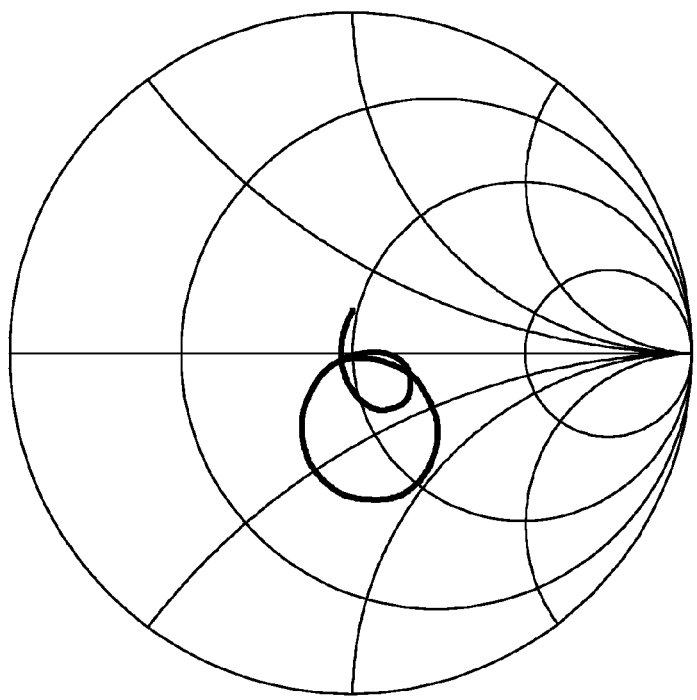
FIG. 7A and FIG. 7B are Smith charts illustrating calculation results of the reflection characteristics of the transmission filter included in the duplexer of the comparative example in the passband of the transmission filter.
Figure 7B:
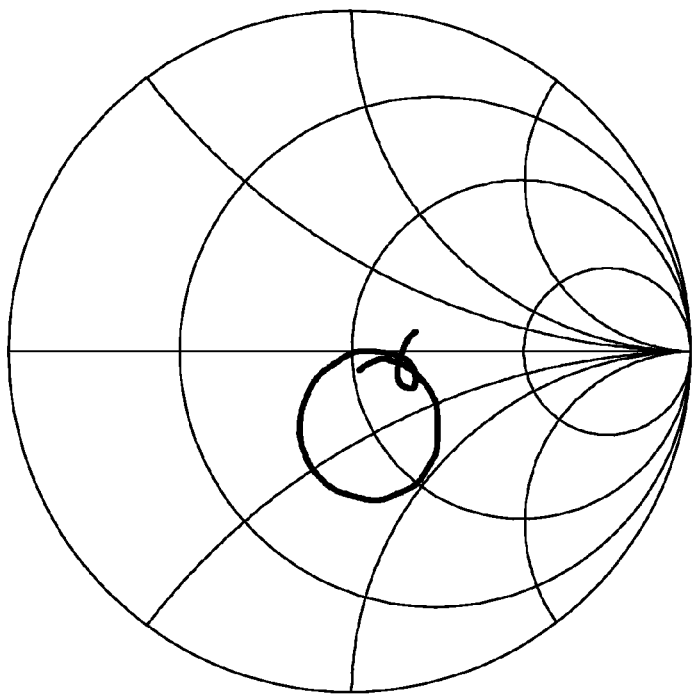
Figure 8A:
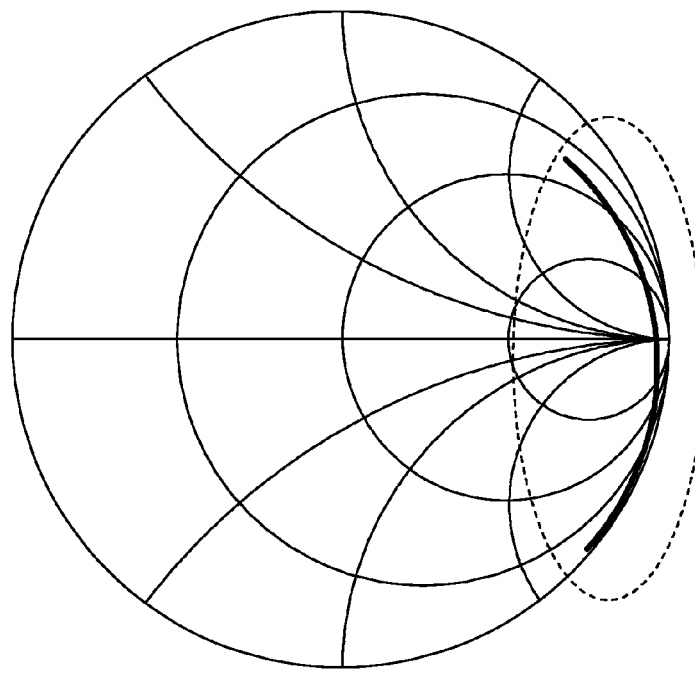
FIG. 8A and FIG. 8B are Smith charts illustrating calculation results of the reflection characteristics of the transmission filter included in the duplexer of the comparative example in the passband of a reception filter.
Figure 8B:
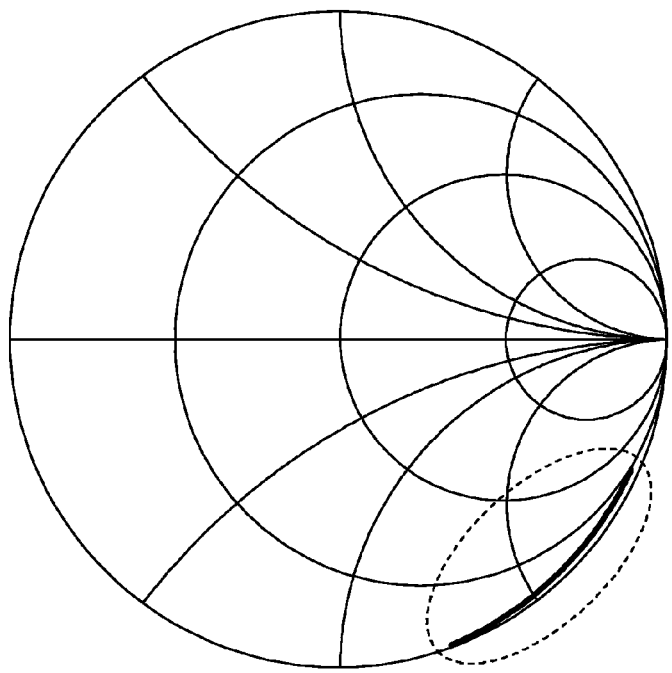

A description will now be given of calculation results of reflection characteristics of the transmission filter. FIG. 6A, FIG. 7A and FIG. 8A illustrate reflection characteristics of the transmission filter F11a. FIG. 6B, FIG. 7B and FIG. 8B illustrate reflection characteristics of the transmission filter F11b.

As illustrated in FIG. 6A and FIG. 6B, the reflection characteristics of the transmission filter F11a, which has the series resonator S1 at the first stage, differ in phase by approximately 90 degrees from those of the transmission filter F11b, which has the parallel resonator P1 at the first stage. More specifically, the phase of the transmission filter F11a is approximately 90 degrees ahead of that of the transmission filter F11b.

As illustrated in FIG. 7A and FIG. 7B, both the reflection characteristics of the transmission filter F11a and the transmission filter F11b are located near the center of the Smith chart in the passband of the transmission filter (the passbands of the transmission filters F11a and F11b). That is to say, the transmission filter F11a and the transmission filter F11b are impedance matched at 50Ω in the passband of the transmission filter.

As indicated with a dotted line in FIG. 8A, the transmission filter F11a and the transmission filter F11b have high impedances in the passband of the reception filter (the passbands of the reception filters F12a and F12b). This reduces the effect of the transmission filter in the passband of the reception filter. Moreover, the impedance matching of the reception filter becomes easy. Therefore, good reception is achieved in the reception filter.

A description will now be given of the reception filter. A circuit diagram of a reception filter F12a is obtained by replacing the transmission terminal Tx with the reception terminal Rx in FIG. 5A. A circuit diagram of a reception filter F12b is obtained by replacing the transmission terminal Tx with the reception terminal Rx in FIG. 5B. The reception filter F12a and the reception filter F12b are seven-stage ladder-type filters. In addition, passbands of the reception filters F12a and F12b are higher than the passbands of the transmission filters F11a and F11b. In the reception filter F12a, the resonator at the first stage is the series resonator S1 as viewed from the antenna terminal Ant side. In the reception filter F12b, the resonator at the first stage is the parallel resonator P1 as viewed from the antenna terminal Ant side.

Conditions used to calculate characteristics are the same as those used to calculate the characteristics of the transmission filter. The filter used for calculation is one of the reception filter F12a, which is obtained by replacing the transmission terminal Tx of the transmission filter F11a in FIG. 5A with the reception terminal Rx, and the reception filter F12b, which is obtained by replacing the transmission terminal Tx of the transmission filter F11b with the reception terminal Rx. The reception filter F12a and the reception filter F12b have mutually inverted arrangements, and have the same characteristics. In addition, the series resonators S1 through S4 are assumed to have the same resonance frequency, and the parallel resonators P1 through P4 are assumed to have the same resonance frequency.

Figure 9:
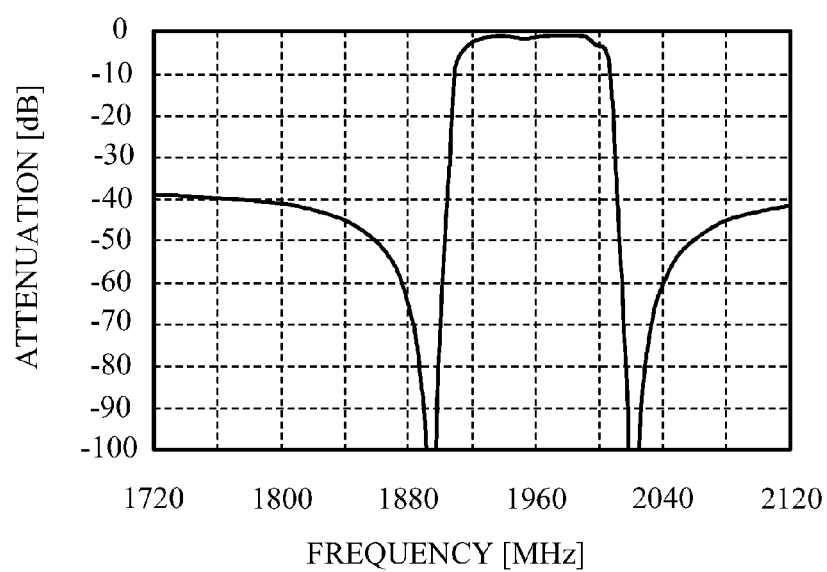
FIG. 9 is a diagram illustrating calculation results of pass characteristics of the reception filter.

As illustrated in FIG. 9, signals are transmitted within 1930 to 1990 MHz, i.e. within the passband, and signals are suppressed outside the passband. As described above, the passband of the reception filter F12a and the passband of the reception filter F12b are located in the reception band of W-CDMA Band 2.

Figure 10A:
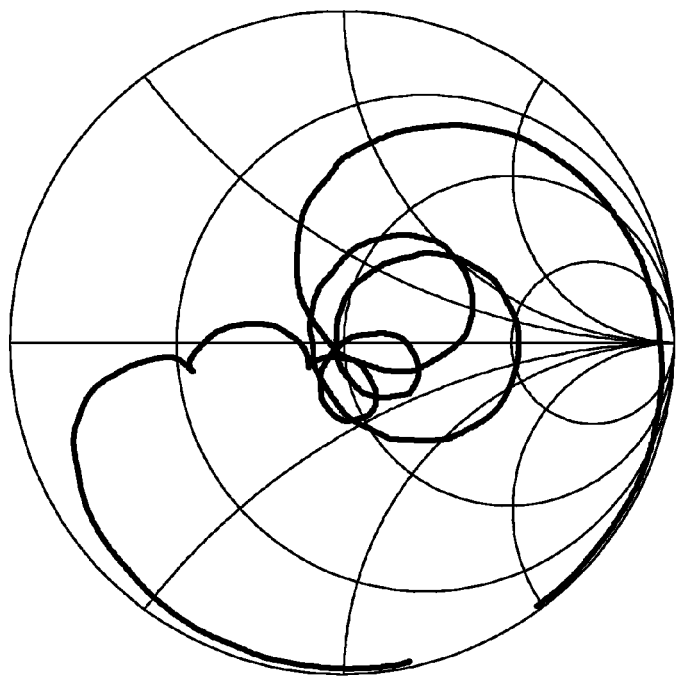
FIG. 10A and FIG. 10B are Smith charts illustrating calculation results of reflection characteristics of the reception filter included in the duplexer in accordance with the comparative example.
Figure 10B:
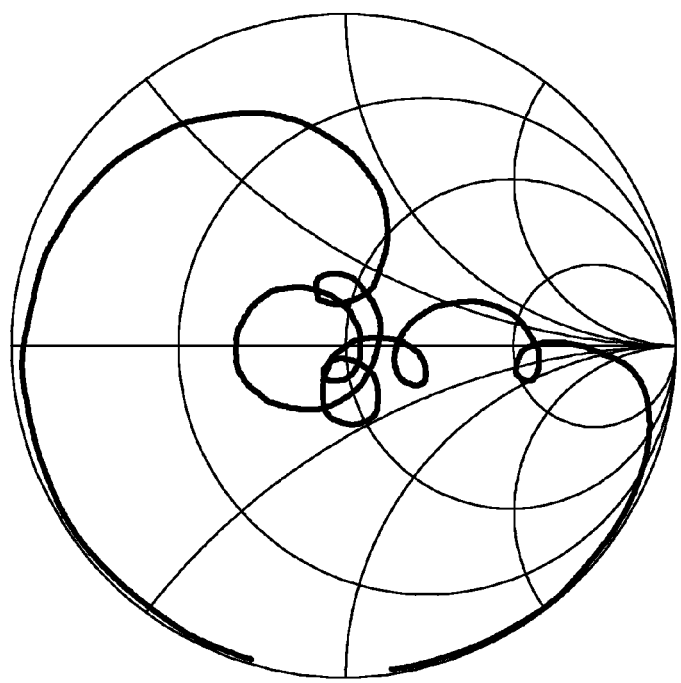
Figure 11A:
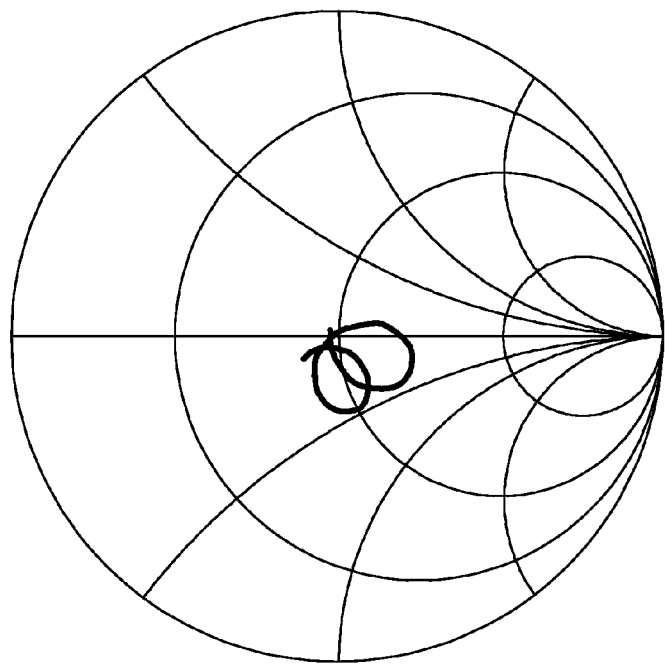
FIG. 11A and FIG. 11B are Smith charts illustrating calculation results of the reflection characteristics of the reception filter included in the duplexer of the comparative example in the passband of the reception filter.
Figure 11B:
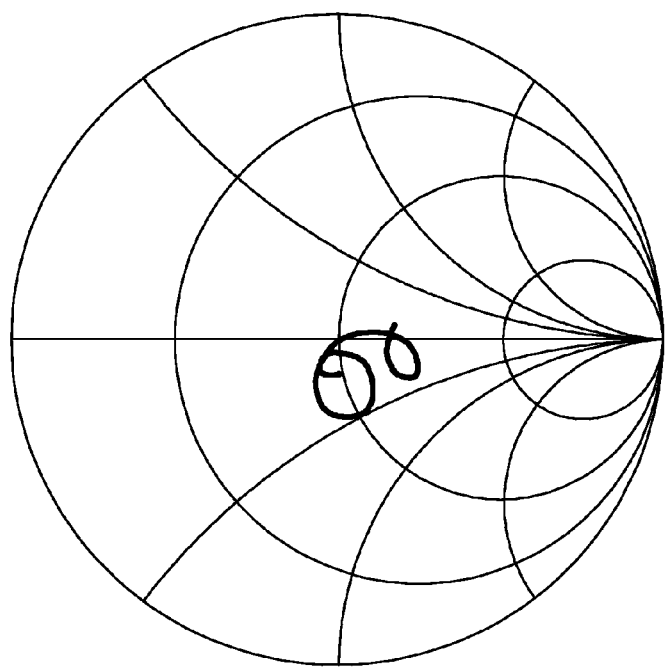
Figure 12A:
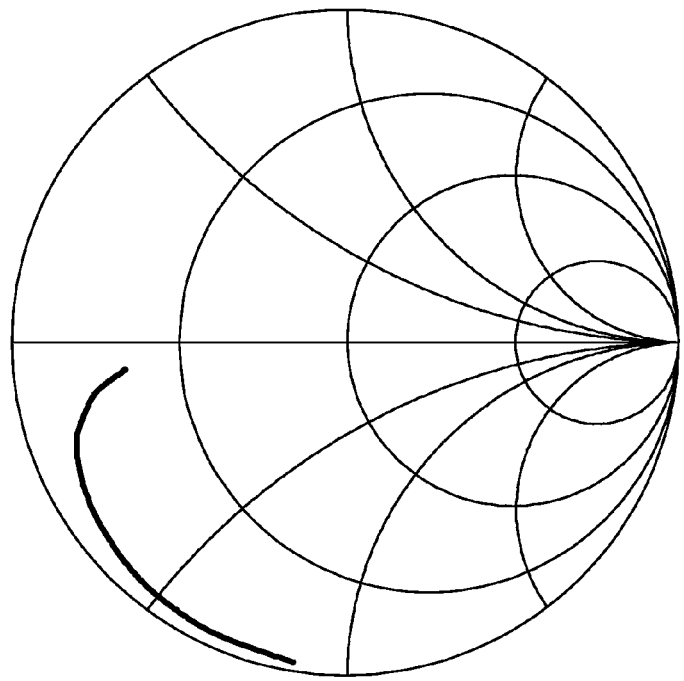
FIG. 12A and FIG. 12B are Smith charts illustrating calculation results of the reflection characteristics of the reception filter included in the duplexer of the comparative example in the passband of the transmission filter.
Figure 12B:
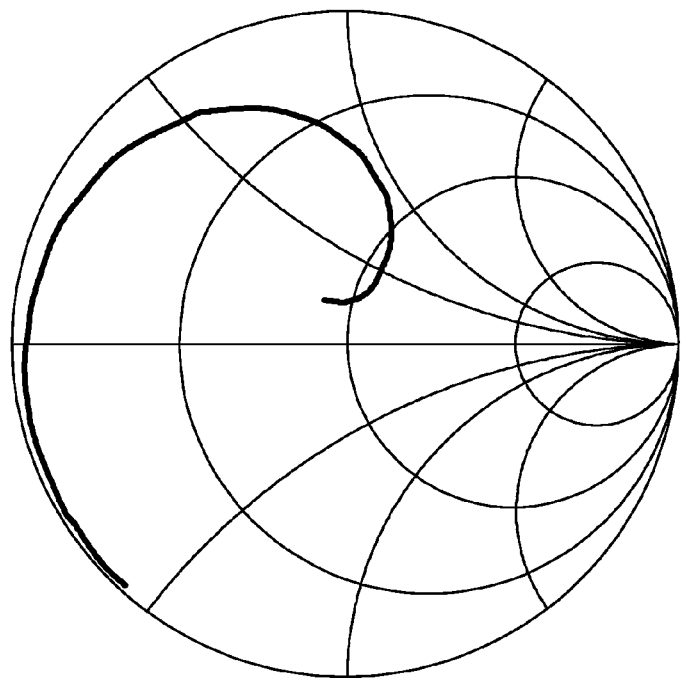
Figure 13A:
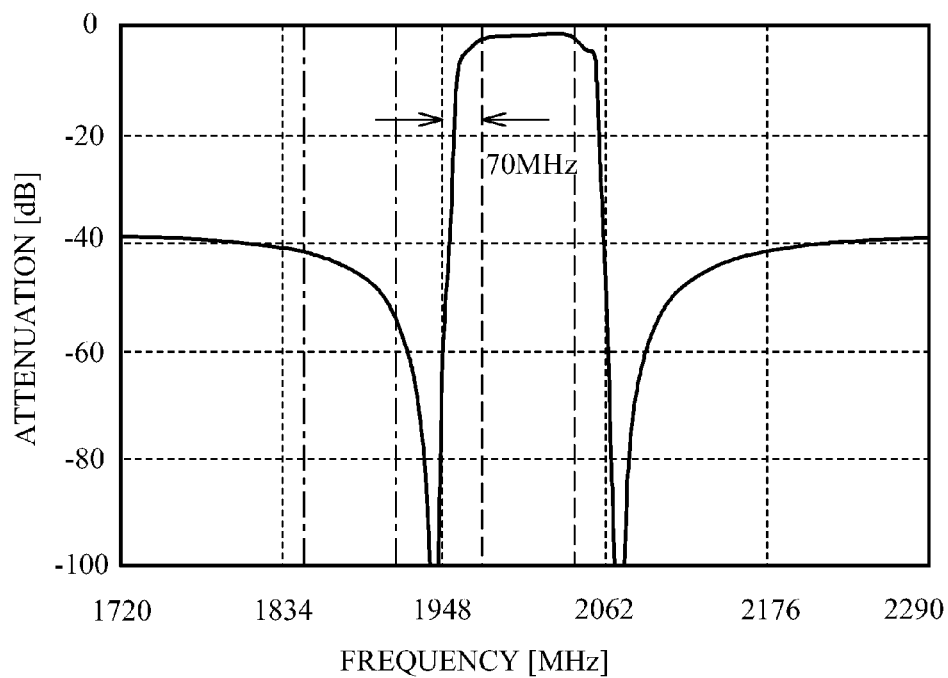
FIG. 13A is a diagram illustrating calculation results of the pass characteristics of the reception filter when a guard band width is 70 MHz.
Figure 13B:
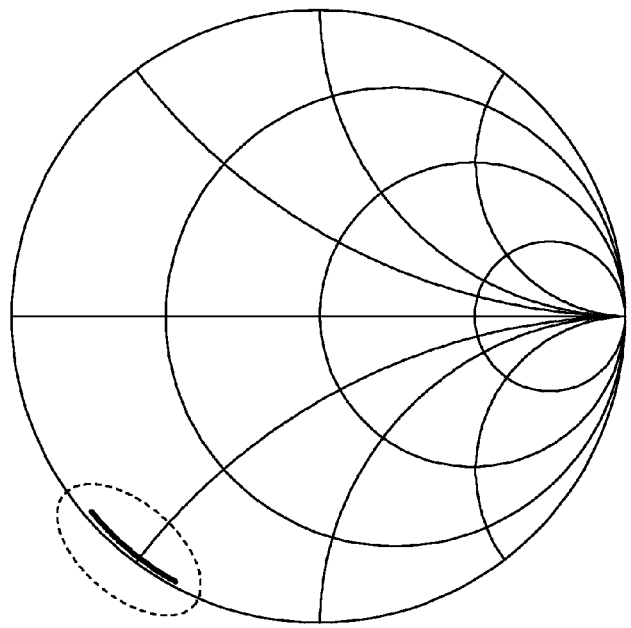
FIG. 13B is a Smith chart illustrating calculation results of the reflection characteristics of the reception filter in the passband of the transmission filter when the guard band width is 70 MHz.
Figure 14A:
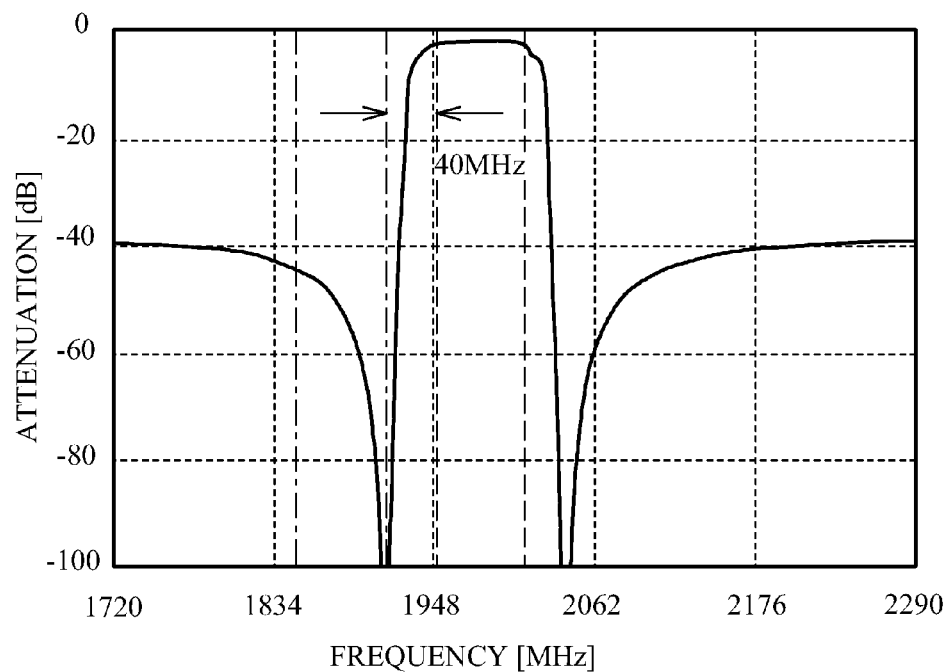
FIG. 14A is a diagram illustrating calculation results of the pass characteristics of the reception filter when the guard band width is 40 MHz.
Figure 14B:
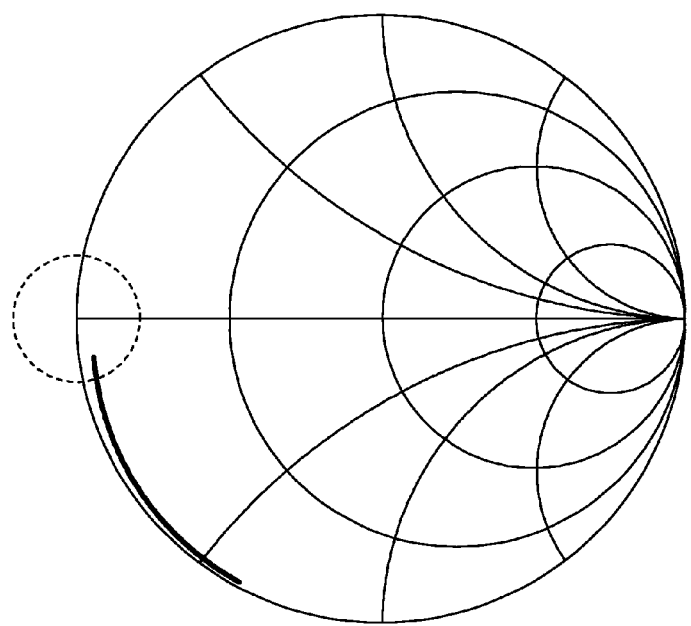
FIG. 14B is a Smith chart illustrating calculation results of the reflection characteristics of the reception filter in the passband of the transmission filter when the guard band width is 40 MHz.
Figure 15A:
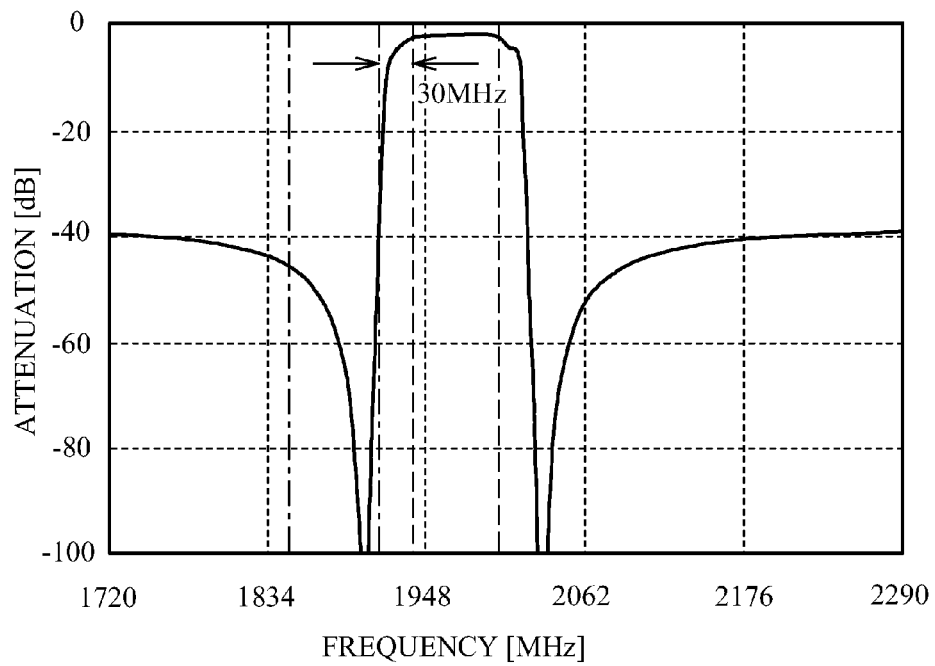
FIG. 15A is a diagram illustrating calculation results of the pass characteristics of the reception filter when the guard band width is 30 MHz.
Figure 15B:
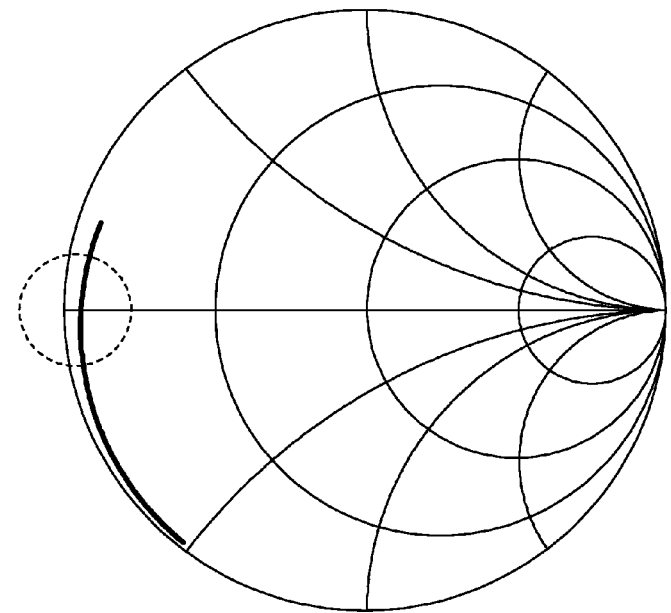
FIG. 15B is a Smith chart illustrating calculation results of the reflection characteristics of the reception filter in the passband of the transmission filter when the guard band width is 30 MHz.
Figure 16A:
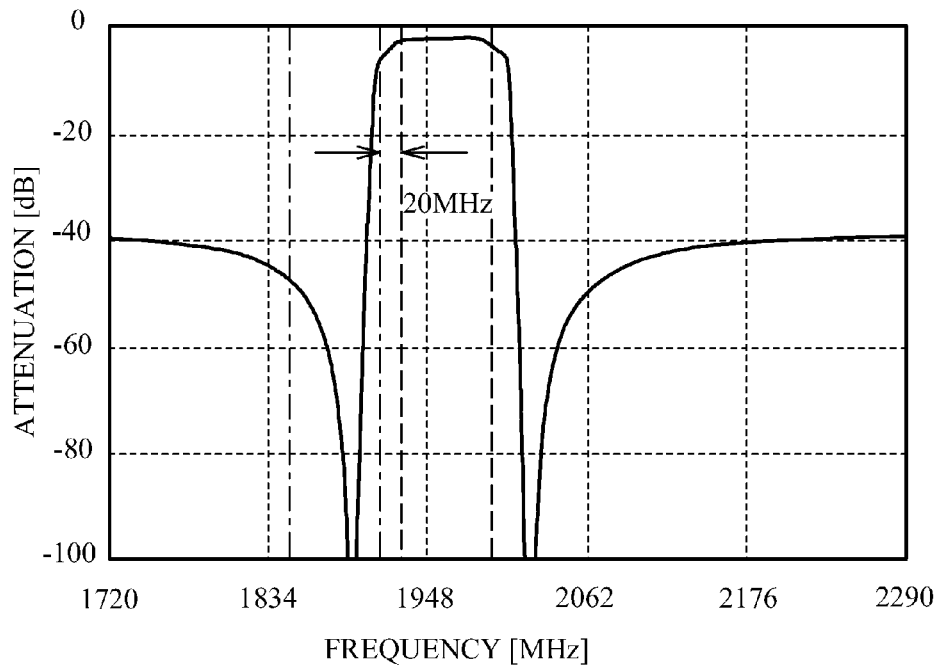
FIG. 16A is a diagram illustrating calculation results of the pass characteristic of the reception filter when the guard band width is 20 MHz.
Figure 16B:
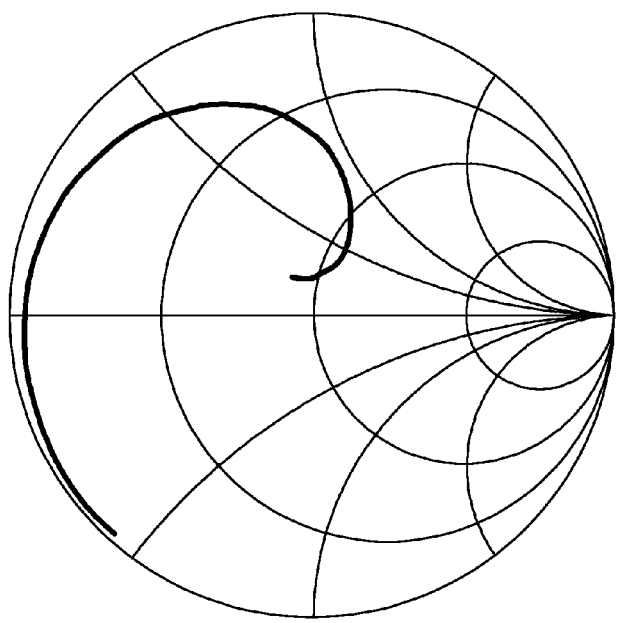
FIG. 16B is a Smith chart illustrating calculation results of the reflection characteristics of the reception filter in the passband of the transmission filter when the guard band width is 20 MHz.

A description will now be given of calculation results of reflection characteristics of the reception filter. FIG. 10A, FIG. 11A, and FIG. 12A illustrate reflection characteristics of the reception filter F12a. FIG. 10B, FIG. 11B, and FIG. 12B illustrate reflection characteristics of the reception filter F12b.

As illustrated in FIG. 10A and FIG. 10B, the reflection characteristics of the reception filter F12a, which has the series resonator S1 at the first stage, differ in phase by approximately 90 degrees from those of the reception filter F12b, which has the parallel resonator P1 at the first stage. As described, the phases differ from each other in a similar way to those of the transmission filters (see FIG. 8A and FIG. 8B).

As illustrated in FIG. 11A and FIG. 11B, both the reflection characteristics of the reception filter F12a and the reception filter F12b pass near the center of the Smith chart in the passband of the reception filter. That is to say, the reception filter F12a and the reception filter F12b are impedance matched at 50Ω in the passband of the reception filter.

As illustrated in FIG. 12A, the impedances of the reception filters F12a and F12b come close to zero in the passband of the transmission filter. That is to say, the reception filter F12a and the reception filter F12b have low impedances in the passband of the transmission filter. This makes the impedance matching of the transmission filter difficult. In this case, characteristics of the duplexer may degrade.

As described above, when the transmission filter and the reception filter are composed of the ladder-type filter including resonators having the same capacitance, the transmission filter has a high impedance in the passband of the reception filter. However, the reception filter has a low impedance in the passband of the transmission filter.

A description will now be given of a simulation that investigates a relationship between a gap between the passband of the transmission filter and the passband of the reception filter and the impedance of the reception filter in the passband of the transmission filter. The simulation calculates the reflection characteristics of the reception filter in the passband of the transmission filter when a gap between the passband of the transmission filter and the passband of the reception filter (guard band width) is 70 MHz, 40 MHz, 30 MHz, or 20 MHz. The passband of the transmission filter is fixed to 1850 to 1910 MHz, and the guard band width is changed by changing the passband of the reception filter. Parameters used for calculation are assumed to be the same as the parameters used for the calculation of FIG. 9 through FIG. 12B previously described.

As illustrated in FIG. 13A through FIG. 16B, the impedance of the reception filter in the passband of the transmission filter further decreases as the passband of the transmission filter comes closer to the passband of the reception filter, and accordingly, the possibility of degradation in characteristics of the duplexer increases.

As illustrated in FIG. 10A through FIG. 12B, the impedance of the filter is small at frequencies lower than the passband of the filter. The reception band is generally higher than the transmission band. Thus, the passband of the reception filter is often higher than the passband of the transmission filter. This results in degradation of suppression of the reception filter in the passband of the transmission filter. Furthermore, as illustrated in FIG. 11A through FIG. 16B, as the gap between the passband of the transmission filter and the passband of the reception filter narrows, the impedance of the reception filter decreases more significantly. Therefore, when the guard band width, which is the gap between the passband of the reception filter and the passband of the transmission filter, is narrowed, the characteristics may further degrade.

To improve the suppression of the reception filter in the passband of the transmission filter, the impedance of the reflection characteristics is commonly adjusted by phase rotation at a side of the reception filter, for example. A phase shifter may be used to rotate the phase.

Figure 17A:
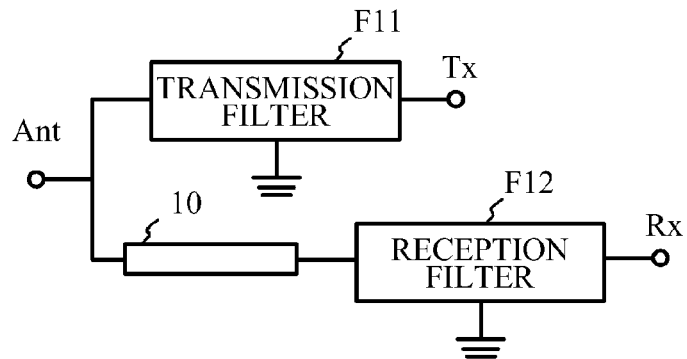
FIG. 17A through FIG. 17C are circuit diagrams illustrating duplexers including a phase shifter.

A duplexer illustrated in FIG. 17A includes a microstrip line 10 between the antenna terminal Ant and the reception filter F12. The microstrip line 10 functions as a phase shifter.

Figure 17B:
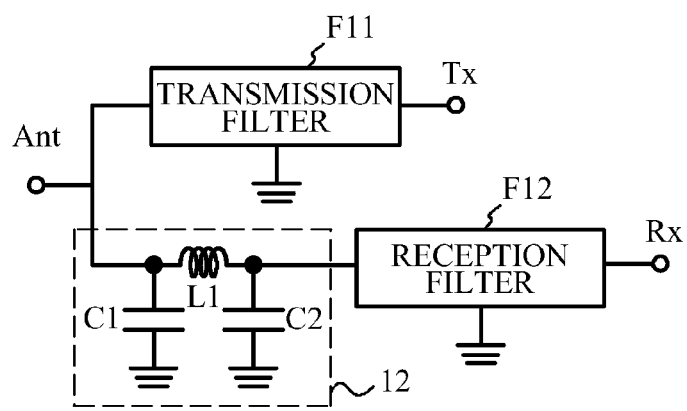

A duplexer illustrated in FIG. 17B includes a n-type phase shifter 12 between the antenna terminal Ant and the reception filter F12, and includes capacitors C1 and C2, and an inductor L1.

Figure 17C:
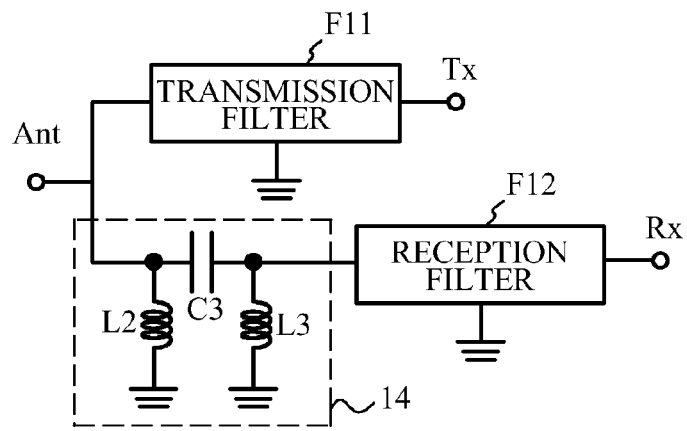

A duplexer illustrated in FIG. 17C includes a n-type phase shifter 14 between the antenna terminal Ant and the reception filter F12, and includes inductors L2 and L3, and a capacitor C3.

The microstrip line 10, and the phase shifters 12 and 14 rotate the phase at the side of the reception filter. For example, the reflection characteristics located near the left edge of the Smith chart illustrated in FIG. 12A and FIG. 12B can be rotated so as to be located near the right edge of the Smith chart. In other words, the phase rotation enables the impedance of the reception filter in the passband of the transmission filter to increase and approach infinity. The suppression of the reception filter is improved with the increase in the impedance of the reception filter in the passband of the transmission filter. However, the insertion of the phase shifter, such as the microstrip line 10, the phase shifter 12 or 14, may add loss by the phase shifter to the loss by the reception filter F12, and increase the loss of the reception signal. That is to say, receiving sensitivity may be reduced. In addition, the duplexer may grow in size, and cost may increase because of a complicating structure.

To suppress the reduction in receiving sensitivity, use of a phase shifter is preferably avoided. The filter itself preferably has a phase rotation function in order to rotate a phase and suppress the reduction in receiving sensitivity. The resonator at the first stage as viewed from the antenna terminal side preferably functions as a capacitor in order to make the filter have the phase rotation function.

Figure 18A:
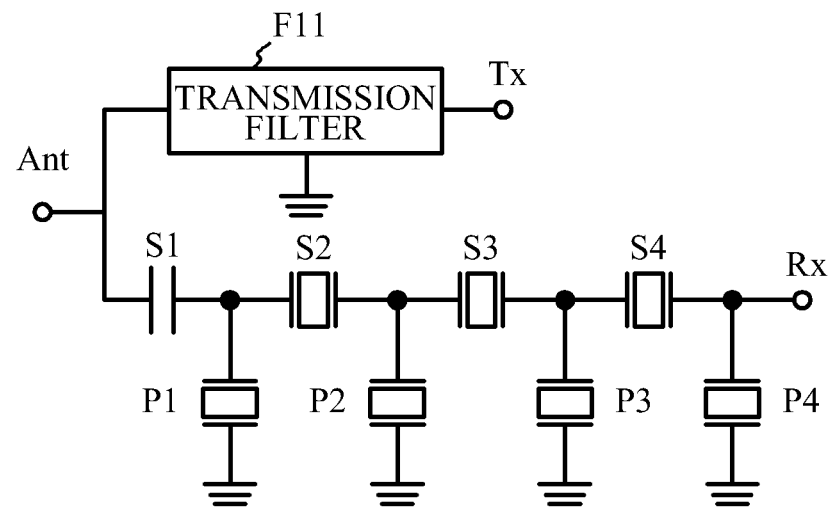
FIG. 18A and FIG. 18B is schematic views illustrating reception filters of which a resonator at a first stage functions as a capacitor.
Figure 18B:
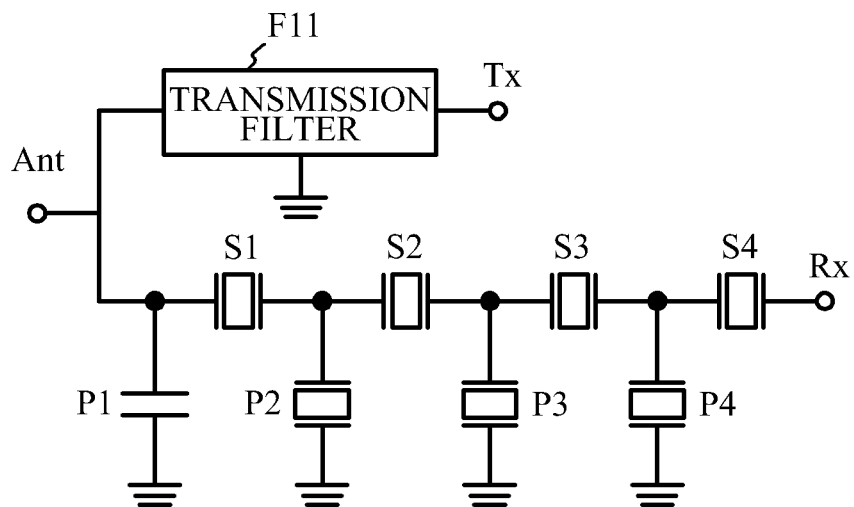

FIG. 18A and FIG. 18B are schematic views illustrating reception filters including a resonator functioning as a capacitor at the first stage. The capacitance ratio Cp/Cs does not affect the phase of the reflection characteristics. In addition, as described in FIG. 3A and FIG. 3B, the increase in the number of stages of the ladder-type filter affects the degree of suppression of the filter, but does not affect the phase of the reflection characteristics. Therefore, the ladder-type filter may be a ladder-type filter having eight or more stages, or less than or equal to six stages obtained by increasing or removing a one-stage ladder-type filter without changing the Cp/Cs.

A reception filter illustrated in FIG. 18A has the series resonator S1 at the first stage as viewed from the antenna terminal Ant side. Here, reducing the size of the series resonator S1 allows the series resonator S1 to function as a capacitor as well as a resonator. In addition, a reception filter illustrated in FIG. 18B has the parallel resonator P1 at the first stage as viewed from the antenna terminal Ant side. Reducing the size of the parallel resonator P1 allows the parallel resonator P1 to function as a capacitor as well as a resonator. That is to say, the series resonator S1 and the parallel resonator P1 rotate phases at the reception filters. The phase rotation enables the impedance of the reception filter in the passband of the transmission filter to be high. The size of the resonator does not change resonance frequencies and anti-resonance frequencies of the series resonator S1 and the parallel resonator P1. Therefore, even when the size of the resonator is reduced, a change in characteristics of the reception filter is suppressed.

Next, considered is a case where the resonator is a piezoelectric thin film resonator.

Figure 19A:
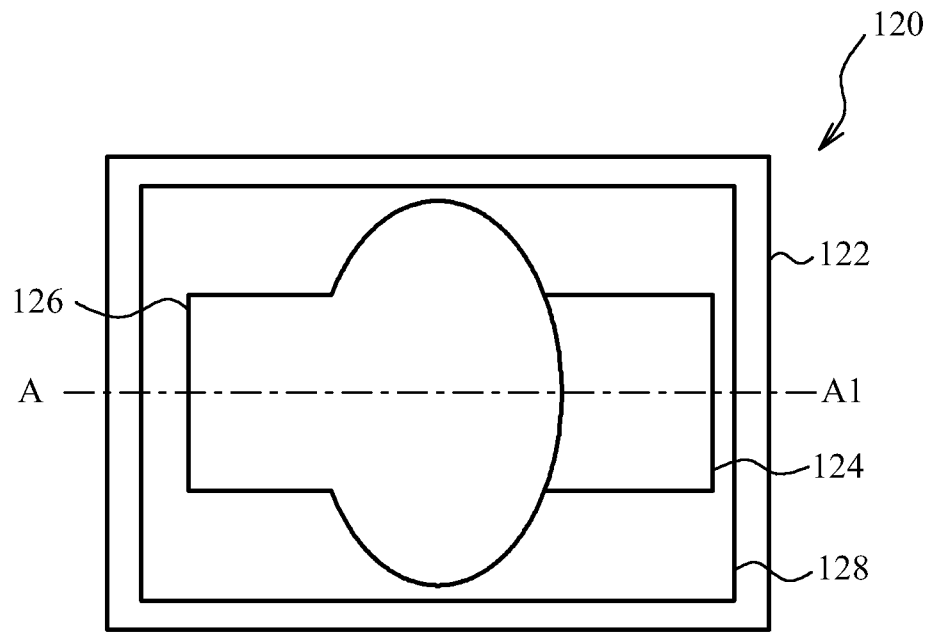
FIG. 19A is a plan view illustrating a piezoelectric thin film resonator.
Figure 19B:
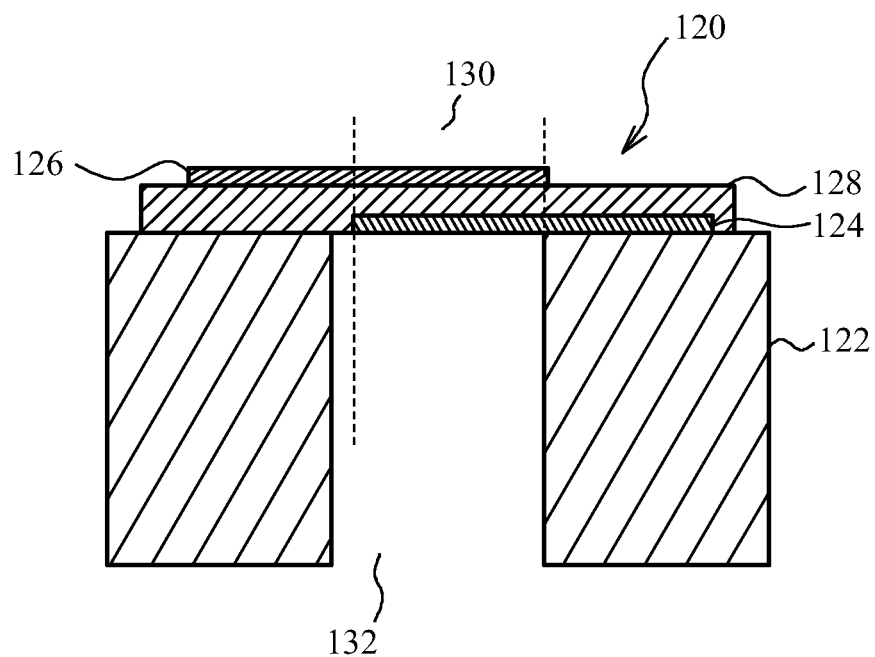
FIG. 19B is a cross-sectional view illustrating the piezoelectric thin film resonator.

As illustrated in FIG. 19A, a piezoelectric thin film resonator 120 includes a substrate 122, a lower electrode 124, an upper electrode 126, and a piezoelectric thin film 128. As illustrated in FIG. 19B, the lower electrode 124 and the upper electrode 126 sandwich the piezoelectric thin film 128. Acoustic waves are excited in a resonance region 130 where the lower electrode 124 and the upper electrode 126 overlap each other across the piezoelectric thin film 128. A penetration hole 132 piercing through the substrate 122 is formed below the resonance region 130. Therefore, the excitation of the acoustic wave is not prevented. The substrate 122 is made of silicon, or glass for example. The lower electrode 124 and the upper electrode 126 may be a film made of aluminum (Al), copper (Cu), molybdenum (Mo), tungsten (W), tantalum (Ta), platinum (Pt), ruthenium (Ru), rhodium (Rh), iridium (Ir), chrome (Cr), or titanium (Ti), or be a composite film of these. The piezoelectric thin film 128 is made of aluminum nitride (AlN), zinc oxide (ZnO), lead zirconate titanate (PZT), or lead titanate ($PbTiO_3$) for example. The resonance frequency of the piezoelectric thin film resonator can be adjusted by adjusting electrode film thicknesses of the lower electrode 124 and the upper electrode 126, and a film thickness of the piezoelectric thin film 128.

A description will be given of other structures of the piezoelectric thin film resonator.

Figure 20A:
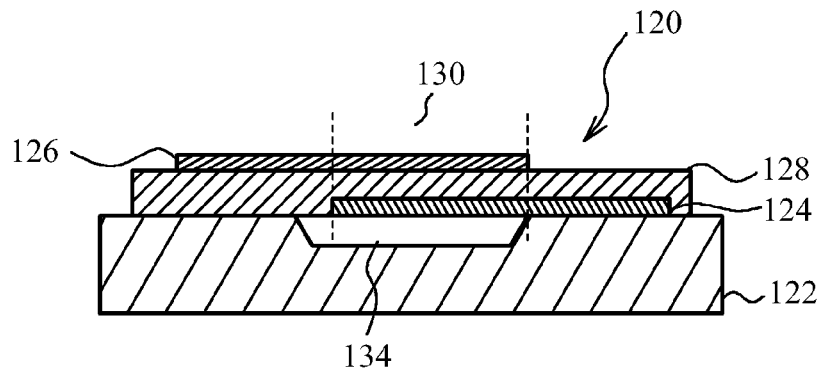
FIG. 20A through FIG. 20C are cross-sectional views illustrating piezoelectric thin film resonators.
Figure 20B:
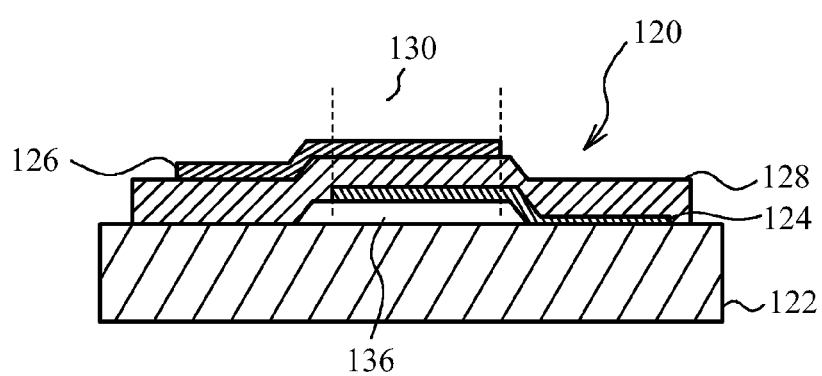
Figure 20C:
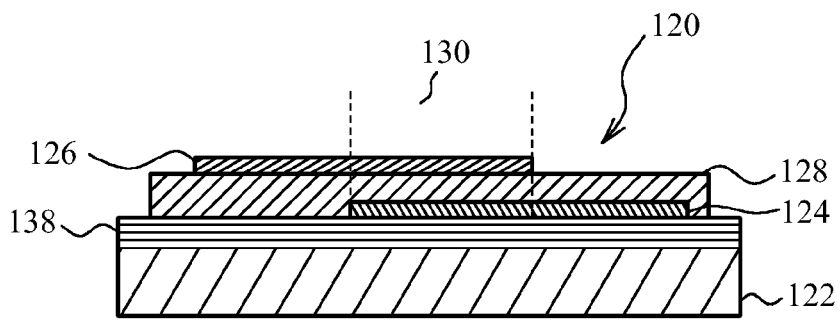

As illustrated in FIG. 20A, the substrate 122 may include a cavity 134. As illustrated in FIG. 20B, the lower electrode 124, the upper electrode 126, and the piezoelectric thin film 128 may be raised to form a space 136 between the lower electrode 124 and the substrate 122. The space 136 has, for example, a dome shape raised upward. As illustrated in FIG. 20C, an acoustic reflection film 138 may be formed between the substrate 122 and the lower electrode 124 and piezoelectric thin film 128. The acoustic reflection film 138 is formed by stacking a film with a high acoustic impedance and a film with a low acoustic impedance alternately with a film thickness of $\lambda/4$ ($\lambda$: the wavelength of the acoustic wave). Electrode film thicknesses of the lower electrode 124 and upper electrode 126, and a film thickness of the piezoelectric thin film 128 affect the resonance frequency of the piezoelectric thin film resonator. An area of the resonance region 130 affects the capacitance of the piezoelectric thin film resonator. The capacitance of the piezoelectric thin film resonator affects the phase of the reflection characteristics of the filter. The filter may use a piezoelectric thin film resonator of FBAR (Film Bulk Acoustic Resonator) type illustrated in FIG. 19B, FIG. 20A and FIG. 20B, or of SMR (Solidly Mounted Resonator) type illustrated in FIG. 20C.

A description will now be given of problems that occur with the use of the piezoelectric thin film resonator. The piezoelectric thin film resonator is a device that uses a resonance of vibration energy (acoustic wave) propagating in a thickness direction. The thickness direction corresponds to a horizontal direction of FIG. 19B, i.e. a direction in which the lower electrode 124, the piezoelectric thin film 128, and the upper electrode 126 are stacked. There may be vibration energy propagating a direction perpendicular to the thickness direction (hereinafter, referred to as an orthogonal direction). The vibration energy in the orthogonal direction is reflected at an edge portion of the resonance region 130, and causes a resonance phenomenon within the resonance region 130. The resonance of the vibration energy propagating in the orthogonal direction causes spurious in the reflection characteristics.

Figure 21A:
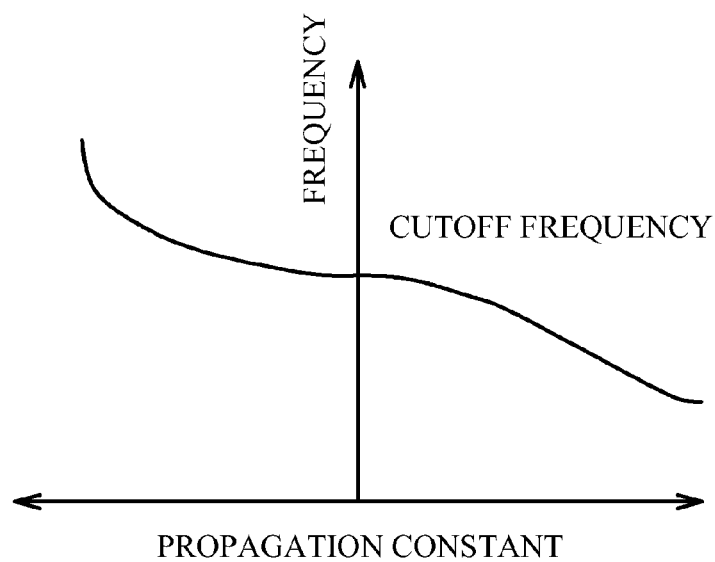
FIG. 21A is a diagram illustrating dispersion characteristics of the piezoelectric thin film resonator.

Dispersion characteristics of the piezoelectric thin film resonator may change a frequency at which spurious occurs. The dispersion characteristics illustrated in FIG. 21A are dispersion characteristics in a mode of the acoustic wave used to make the filter function. In FIG. 21A, the vertical axis represents frequency, and the horizontal axis represents propagation constant in the orthogonal direction. The propagation constant is an imaginary number in a region on the left of the intersection of the horizontal axis and the vertical axis. When the propagation constant is an imaginary number, the vibration energy in the orthogonal direction does not exist. The propagation constant is a real number in a region on the right of the intersection of the horizontal axis and the vertical axis. When the propagation constant is a real number, the vibration energy in the orthogonal direction exists. In addition, the intersection of a dispersion curve, which is illustrated with a solid line in FIG. 21A, and the vertical axis represents a cutoff frequency. The cutoff frequency defines a boundary between a state where the propagation constant is an imaginary number and a state where it is a real number. That is to say, the cutoff frequency defines a boundary between a state where the vibration energy in the orthogonal direction exists and a state where it does not exist. The cutoff frequency is a frequency approximately equal to the resonance frequency of the piezoelectric thin film resonator. FIG. 21A through FIG. 22B are schematic views.

Figure 21B:
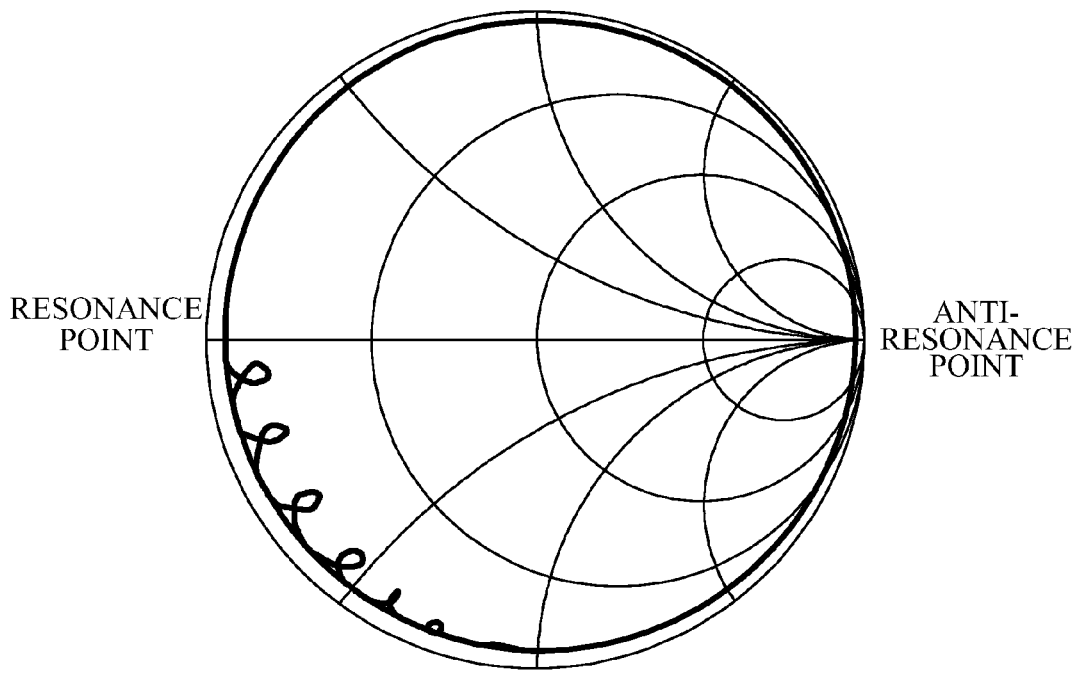
FIG. 21B is a Smith chart illustrating reflection characteristics of the piezoelectric thin film resonator.

As illustrated in FIG. 21A, the propagation constant is a real number at frequencies lower than the cutoff frequency. In addition, the propagation constant is an imaginary number at frequencies higher than the cutoff frequency. That is to say, the vibration energy in the orthogonal direction exists at frequencies lower than the cutoff frequency. As illustrated in FIG. 21B, spurious is observed in the reflection characteristics in a region from the anti-resonance point to the resonance point. As described above, the vibration energy in the orthogonal direction causes spurious.

A description will now be given of the piezoelectric thin film resonator with reference to FIG. 22A and FIG. 22B.

Figure 22A:
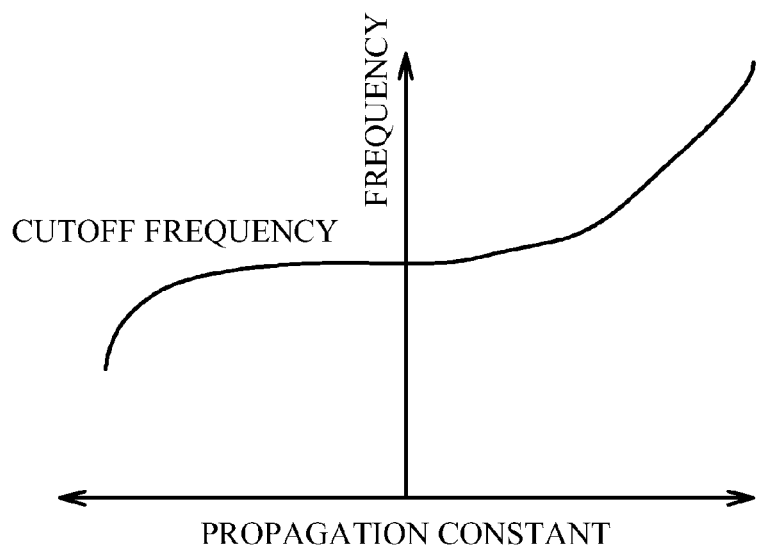
FIG. 22A is a diagram illustrating the dispersion characteristics of the piezoelectric thin film resonator.
Figure 22B:
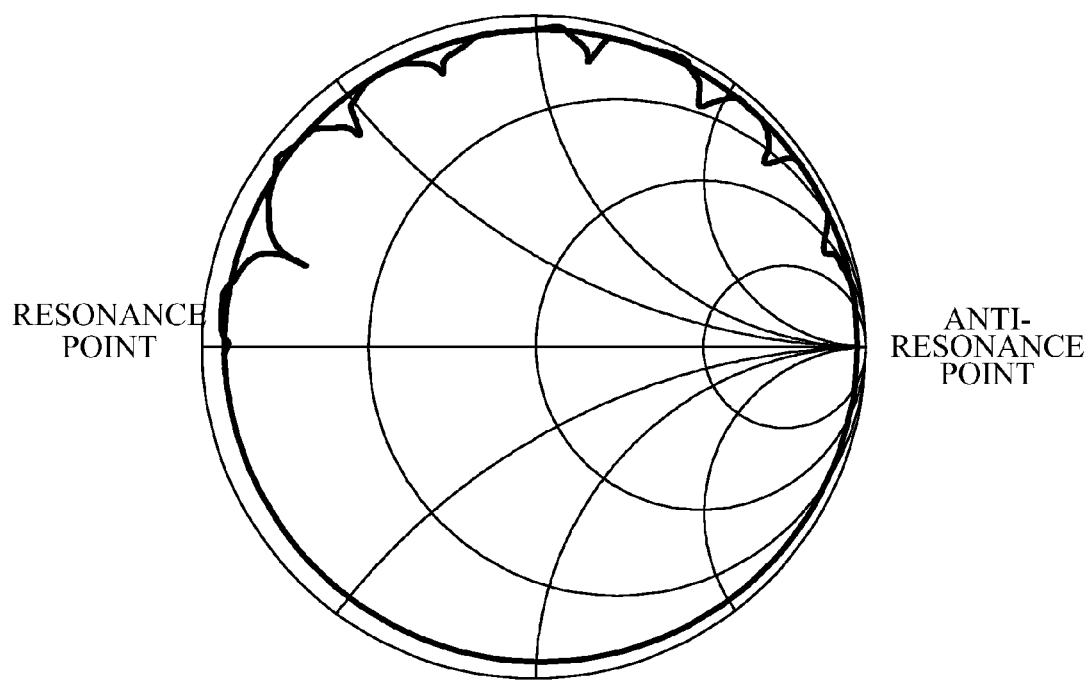
FIG. 22B is a Smith chart illustrating the reflection characteristics of the piezoelectric thin film resonator.

As illustrated in FIG. 22A, the propagation constant is a real number at frequencies higher than the cutoff frequency. In addition, the propagation constant is an imaginary number at frequencies lower than the cutoff frequency. That is to say, the vibration energy in the orthogonal direction exists at frequencies higher than the cutoff frequency. As illustrated in FIG. 22B, spurious is observed in the reflection characteristics at frequencies higher than the frequency of the resonance point. As described above, the vibration energy in the orthogonal direction causes spurious. In the following description, the dispersion characteristics illustrated in FIG. 21A is referred to as a frequency decreasing type, and the dispersion characteristics illustrated in FIG. 22A is referred to as a frequency increasing type.

Figure 23A:
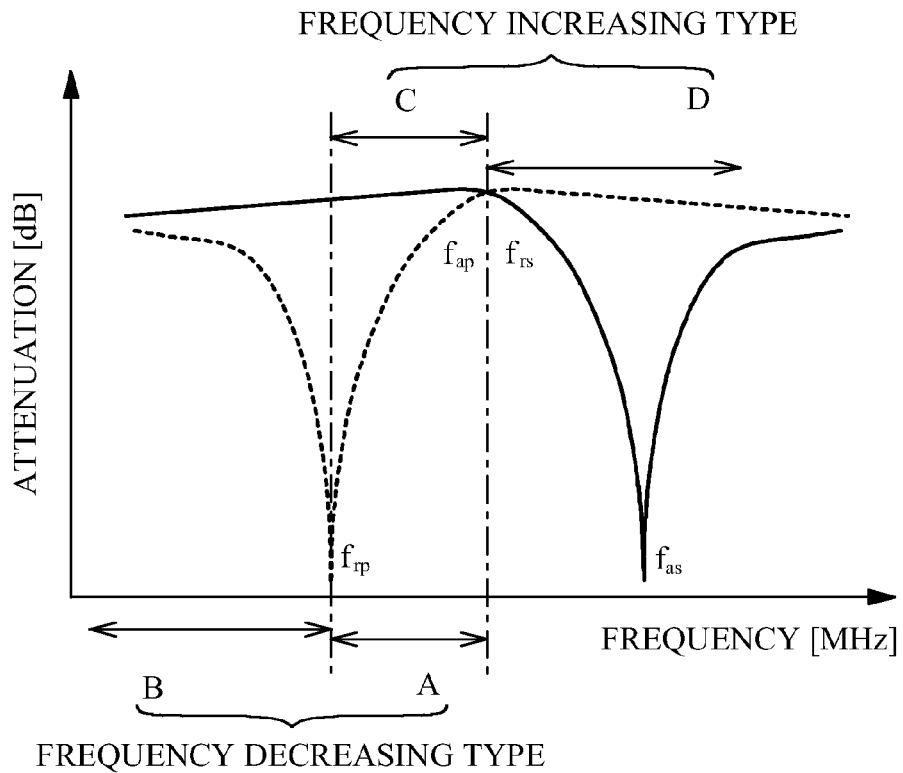
FIG. 23A is a diagram illustrating a region where a ripple occurs in pass characteristics of the series resonator and the parallel resonator.

A description will be given of an effect of spurious on pass characteristics of the filter. In FIG. 23A, the horizontal axis represents frequency, and the vertical axis represents attenuation. Pass characteristics of FIG. 23A are the same as those illustrated in FIG. 1C.

As illustrated in a lower part of FIG. 23A, when the series resonator S21 (see FIG. 1A) and the parallel resonator P21 (see FIG. 1B) are piezoelectric thin film resonators having dispersion characteristics of frequency decreasing type, spurious occurs in the series resonator S21 in a region A between the resonance point $f_{rs}$ of the series resonator S21 and the resonance point $f_{rp}$ of the parallel resonator P21. Spurious occurs in the series resonator S21 and the parallel resonator P21 in a region B lower than the resonance point $f_{rp}$. However, the region B is located outside the passband of the ladder-type filter formed by the series resonator S21 and the parallel resonator P21. Therefore, the spurious occurring in the region B has a small effect on the pass characteristics of the ladder-type filter.

As illustrated in an upper part of FIG. 23A, when the series resonator S21 and the parallel resonator P21 are piezoelectric thin film resonators having dispersion characteristics of frequency increasing type, spurious occurs in the parallel resonator P21 in a region C between the resonance point $f_{rp}$ of the parallel resonator P21 and the resonance point $f_{rs}$ of the series resonator S21. Spurious occurs in the series resonator S21 and the parallel resonator P21 in a region D higher than the resonance point $f_{rs}$. Compared to the spurious occurring in the series resonator S21, the spurious occurring in the parallel resonator P21 has a large effect on the pass characteristics of the ladder-type filter.

When the piezoelectric thin film resonator having dispersion characteristics of frequency decreasing type is used as the resonator of the ladder-type filter, the spurious occurring in the series resonator greatly affect the pass characteristics of the filter. In addition, when the piezoelectric thin film resonator having dispersion characteristics of frequency increasing type is used, the spurious occurring in the parallel resonator greatly affect the pass characteristics of the filter. The frequency of the resonance point $f_{rs}$ of the series resonator S21 is equal to that of the anti-resonance point $f_{ap}$ of the parallel resonator P21 in FIG. 23A, but may differ from that of the anti-resonance point $f_{ap}$ of the parallel resonator P21.

Figure 23B:
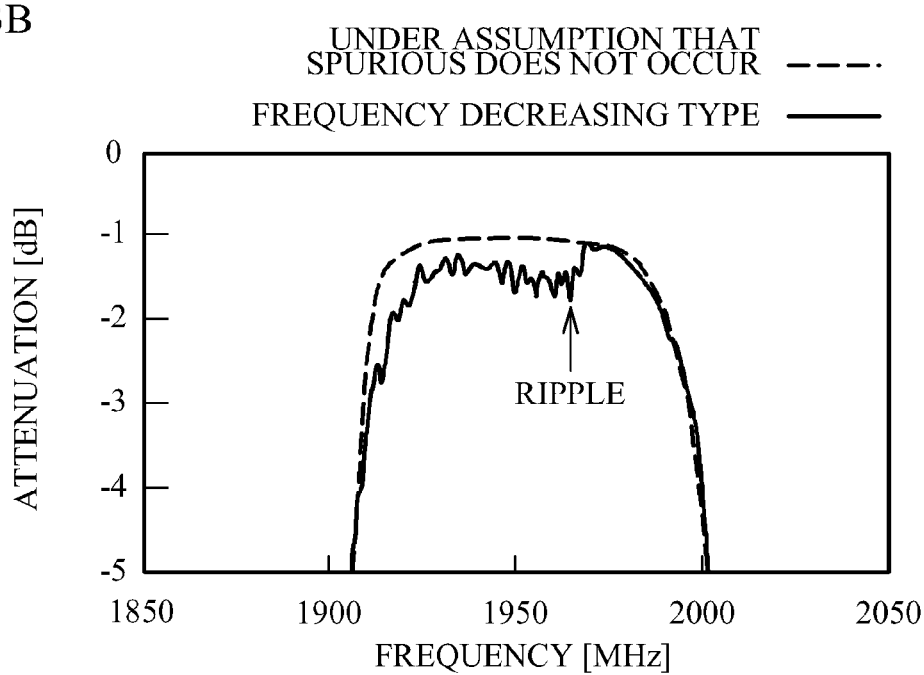
FIG. 23B is a diagram illustrating calculation results of pass characteristics of a filter including a piezoelectric thin film resonator having dispersion characteristics of frequency decreasing type.

A description will now be given of simulation results of the pass characteristics of the filter designed under the assumption that spurious occurs. A filter used for the simulation is the same as the reception filter used to calculate the pass characteristics of FIG. 9. In FIG. 23B, the horizontal axis represents frequency, and the vertical axis represents attenuation. The dashed line represents pass characteristics of a reception filter designed under the assumption that spurious does not occur. The solid line represents pass characteristics of the reception filter that uses the piezoelectric thin film resonator having dispersion characteristics of frequency decreasing type, and designed under the assumption that spurious occurs.

As illustrated with an arrow in FIG. 23B, ripples occur at frequencies lower than approximately 1970 MHz in the passband. The ripple is due to the spurious occurring in the piezoelectric thin film resonator. In addition, as the piezoelectric thin film resonator has dispersion characteristics of frequency decreasing type, the spurious is due to the series resonator. That is to say, when the piezoelectric thin film resonator has dispersion characteristics of frequency decreasing type, the spurious occurring in the reflection characteristics of the series resonator causes a ripple at a low frequency side of the passband of the filter. In addition, when used is the piezoelectric thin film resonator having dispersion characteristics of frequency increasing type, the spurious occurring in the reflection characteristics of the parallel resonator causes a ripple at a high frequency side of the passband of the filter. As described above, the spurious occurring in the piezoelectric thin film resonator degrades pass characteristics of the filter, and also degrades characteristics of the duplexer using the filter.

Spurious is due to the resonance of the vibration energy propagating in the direction perpendicular to the thickness direction of the piezoelectric thin film. Therefore, spurious can be suppressed by increasing a distance through which the vibration energy propagates. A propagation distance is increased by increasing an area of the resonance region 130 (see FIG. 19B). A length of the piezoelectric thin film, which is a distance of the piezoelectric thin film 128 in a lateral direction in FIG. 19 for example, is increased by increasing the area of the resonance region 130.

Increase in the area of the resonance region 130 means an increase in capacitance of the piezoelectric thin film resonator. As described above, spurious is suppressed by increasing the capacitance of the piezoelectric thin film resonator. A description will now be given of simulation results of reflection characteristics when the capacitance of the piezoelectric thin film resonator is changed. The piezoelectric thin film resonator is assumed to have dispersion characteristics of frequency decreasing type. FIG. 24A through FIG. 27 are Smith charts illustrating calculation results of the reflection characteristics of the piezoelectric thin film resonator. The capacitance of the piezoelectric thin film resonator is 0.76 pF in FIG. 24A, 1.1 pF in FIG. 24B, 1.5 pF in FIG. 25A, 1.9 pF in FIG. 25B, 2.2 pF in FIG. 26A, 2.6 pF in FIG. 26B, and 2.8 pF in FIG. 27.

Figure 24A:
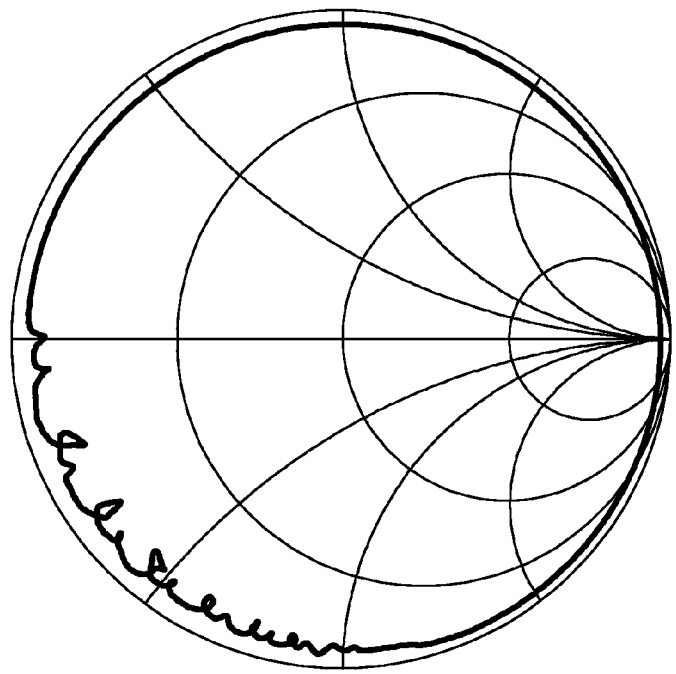
FIG. 24A and FIG. 24B are Smith charts illustrating calculation results of the reflection characteristics of the piezoelectric thin film resonator.
Figure 24B:
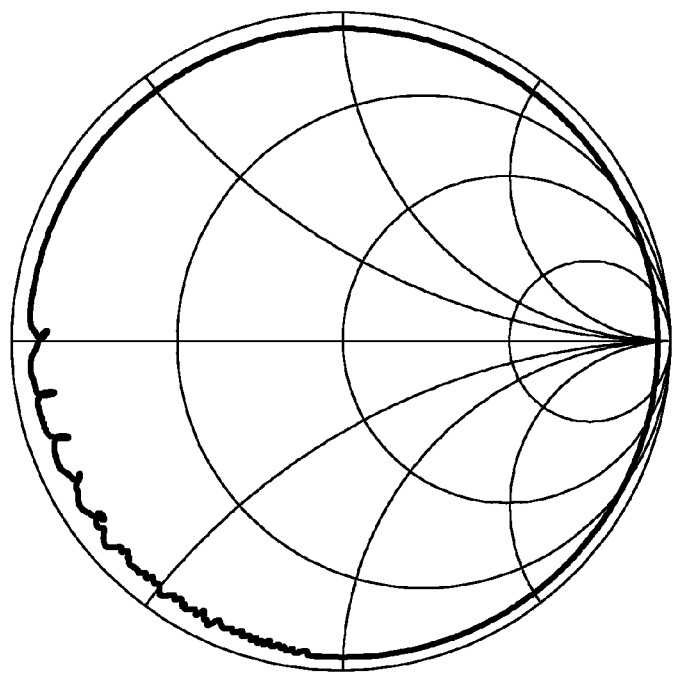

As illustrated in FIG. 24A and FIG. 24B, spurious occurs at frequencies lower than the frequency of the resonance point. The spurious occurs from the left edge toward near the lower edge of the Smith chart. In addition, the spurious in the piezoelectric thin film resonator with a capacitance of 1.1 pF illustrated in FIG. 24B is smaller than that in the piezoelectric thin film resonator with a capacitance of 0.76 pF illustrated in FIG. 24A.

Figure 25A:
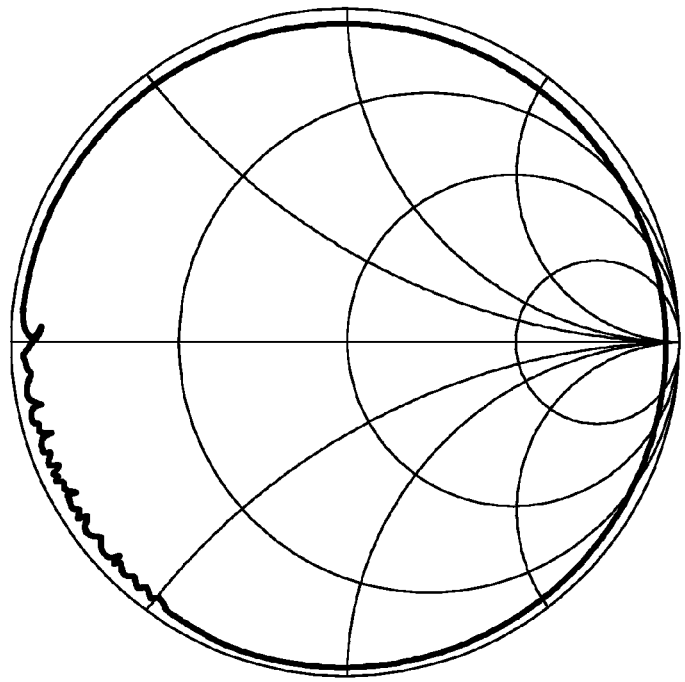
FIG. 25A and FIG. 25B are Smith charts illustrating calculation results of the reflection characteristics of the piezoelectric thin film resonator.
Figure 25B:
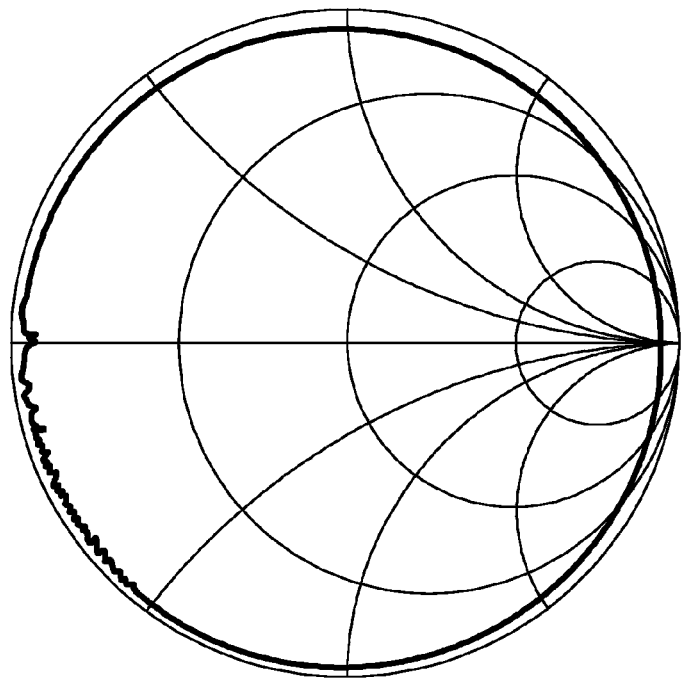
Figure 26A:
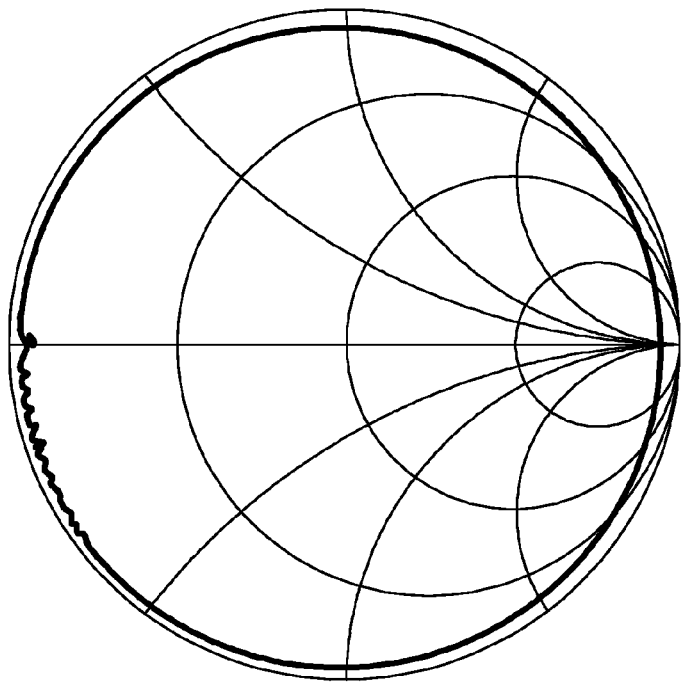
FIG. 26A and FIG. 26B are Smith charts illustrating calculation results of the reflection characteristics of the piezoelectric thin film resonator.
Figure 26B:
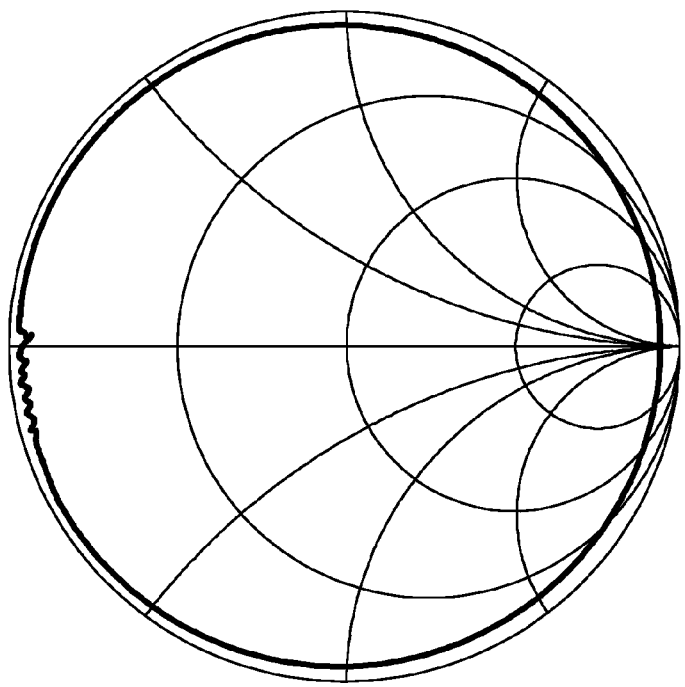
Figure 27:
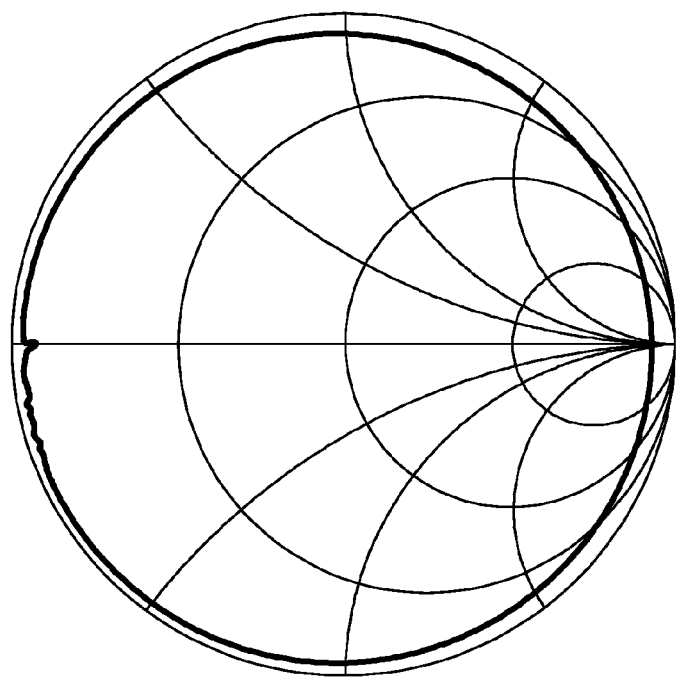
FIG. 27 is a Smith chart illustrating calculation results of the reflection characteristics of the piezoelectric thin film resonator.

As illustrated in FIG. 25A and FIG. 25B, spurious also occurs when the capacitance is 1.5 pF or 1.9 pF. However, the magnitude of the spurious is smaller than those illustrated in FIG. 24A and FIG. 24B. In addition, spurious hardly occurs near the lower edge of the Smith chart, and the reflection characteristics curve smoothly. Furthermore, as illustrated in FIG. 26A through FIG. 27, the spurious becomes further smaller as the capacitance is increased. As illustrated in FIG. 27, when the capacitance is 2.8 pF, the reflection characteristics curve almost smoothly even near the left edge of the Smith chart. As described above, spurious is suppressed with increase in the capacitance of the piezoelectric thin film resonator.

In addition, as illustrated in FIG. 21A through FIG. 22B, a frequency at which spurious occurs changes in accordance with the dispersion characteristics of the piezoelectric thin film resonator. Therefore, to suppress the spurious occurring in the pass characteristics of the ladder-type filter efficiently, the resonator of which the capacitance is increased is preferably changed in accordance with the dispersion characteristics of the piezoelectric thin film resonator included in the ladder-type filter. That is to say, when the piezoelectric thin film resonator having dispersion characteristics of frequency decreasing type is used as the resonator of the ladder-type filter, the capacitance of the series resonator is preferably made to be large. When the piezoelectric thin film resonator having dispersion characteristics of frequency increasing type is used as the resonator of the ladder-type filter, the capacitance of the parallel resonator is preferably made to be large.

However, to rotate a phase at the reception filter without using a phase shifter, the capacitance of the piezoelectric thin film resonator at the first stage included in the reception filter needs to be reduced as described in FIG. 18A and FIG. 18B. Rotating a phase at the reception filter can increase the impedance of the reception filter in the passband of the transmission filter, and improve characteristics of the duplexer. Therefore, the reception filter using the piezoelectric thin film resonator is required to achieve both the phase rotation and the reduction of spurious.

The phase rotation and the reduction of spurious may be achieved by a method that serially divides a piezoelectric thin film resonator. For example, a single piezoelectric thin film resonator, such as the S1 in FIG. 5A, is serially divided into two or more piezoelectric thin film resonators. The piezoelectric thin film resonators are connected in series. The total capacitance of the piezoelectric thin film resonators is equal to the capacitance of the single piezoelectric thin film resonator before division. Therefore, the phase rotation is possible even when the piezoelectric thin film resonator is divided. Moreover, one or some of the piezoelectric thin film resonators have capacitances larger than that of the single piezoelectric thin film resonator before division. In other words, there is a piezoelectric thin film resonator having a large area of the resonance region. Therefore, the suppression of spurious also becomes possible. However, the division of the piezoelectric thin film resonator may increase a filter size. The duplexer grows in size as the filter size increases. Therefore, optimizing the single piezoelectric thin film resonator to be divided and the capacitances of the piezoelectric thin film resonators is required at the same time as suppressing the increase in filter size.

To discover the optimum design that achieves the phase rotation and the suppression of spurious, a simulation of reflection characteristics were conducted, and the degree of reduction in capacitance when the phase rotation is performed was investigated.

A description will be given of a filter used for the simulation. The filter is assumed to be a reception filter supporting W-CDMA Band 2. Conditions are as follows.

Passband of the transmission filter: 1850 to 1910 MHz

Passband of the reception filter: 1930 to 1960 MHz

Capacitance Cs: 1.12 pF

Capacitance Cp: 1.87 pF

The reception filter is assumed to be a seven-stage ladder-type filter. That is to say, the reception filter is assumed to be a filter obtained by replacing the transmission terminal Tx with the reception terminal Rx in the ladder-type filter illustrated in FIG. 5A and FIG. 5B. The piezoelectric thin film resonator included in the reception filter has a capacitance that allows a phase to be rotated and the impedance in the passband of the transmission filter to increase. Two cases are considered. One is a case where the series resonator S1 is the resonator at the first stage included in the reception filter as viewed from the antenna terminal Ant side (see FIG. 5A), and the other is a case where the parallel resonator P1 is the resonator at the first stage (see FIG. 5B). The case where the series resonator S1 is located at the first stage is considered first.

A description will be given of calculation results of the capacitance. Table 1 lists calculation results of capacitances of the resonators in the ladder-type filter having the series resonator S1 (see dotted line in the table) for the resonator at the first stage as viewed from the antenna terminal Ant side. First columns represent a type of resonator. Second columns represent a capacitance of the resonator of the comparative example that does not take into account the phase rotation. Third columns represent a degree of reduction in capacitance obtained by comparing the case where the phase rotation is performed to the case where the phase rotation is not performed. Fourth columns represent a capacitance of the resonator when the phase rotation is performed. The products of the capacitances presented in the second columns and the degrees of reduction presented in the third columns are the capacitances presented in the fourth columns.

TABLE 1

| RESONATOR | CAPACITANCE IN COMPARATIVE EXAMPLE | DEGREE OF REDUCTION (%) | CAPACITANCE WHEN PHASE ROTATION IS PERFORMED |
|---|---|---|---|
| S1 | Cs | 25 | 0.25 Cs |
| S2 | 0.5 Cs | 96 | 0.48 Cs |
| S3 | 0.5 Cs | 110 | 0.55 Cs |
| S4 | 0.5 Cs | 96 | 0.48 Cs |
| P1 | 2 Cp | 41 | 0.82 Cp |
| P2 | 2 Cp | 71 | 1.42 Cp |
| P3 | 2 Cp | 80 | 1.6 Cp |
| P4 | Cp | 95 | 0.95 Cp |

The reason why the capacitances are 0.5Cs and 2 Cp in the comparative example is because the capacitances are combined when the resonators are combined as described in FIG. 3A and FIG. 3B.

As presented in Table 1, when the series resonator S1 is located at the first stage, the capacitance of the series resonator S1 is reduced by 25% from that of the comparative example, and becomes 0.25Cs. The capacitances of the series resonators S2 and S4 are reduced by 96%, and become 0.48Cs. The capacitance of the series resonator S3 is reduced by 110%, and becomes 0.55Cs. The capacitance of the parallel resonator P1 is reduced by 41%, and becomes 0.82 Cp. The capacitance of the parallel resonator P2 is reduced by 71%, and becomes 1.42 Cp. The capacitance of the parallel resonator P3 is reduced by 80%, and becomes 1.6 Cp. The capacitance of the parallel resonator P4 is reduced by 95%, and becomes 0.95 Cp. The impedance of the reception filter can be increased by making the resonators have capacitances presented in Table 1.

A description will now be given of the suppression of spurious. A description will first be given of a case where the resonators S1 through S4 and P1 through P4 are piezoelectric thin film resonators having dispersion characteristics of frequency decreasing type. As described in FIG. 23A, when the piezoelectric thin film resonator has dispersion characteristics of frequency decreasing type, the series resonator greatly affects spurious. In addition, as described in FIG. 24A through FIG. 27, spurious decreases as the capacitance of the piezoelectric thin film resonator increases. On the other hand, spurious increases as the capacitance of the piezoelectric thin film resonator decreases. Therefore, in the comparative example presented in the second columns in Table 1, the series resonators S2 through S4, which have smallest capacitances of 0.5Cs among the series resonators S1 through S4, affect the magnitude of the spurious.

As presented in the fourth columns in Table 1, when the phase rotation is performed, the series resonator S1 at the first stage has a minimum capacitance value of 0.25Cs in the series resonators S1 through S4. Therefore, spurious can be suppressed by making the capacitance of the series resonator S1 large, i.e. by making the area of the resonance region in the series resonator S1 large. For example, the series resonator S1 is serially divided into two to make the area of the resonance region in the series resonator S1 large. One of the series resonators formed by division has a resonance region with an area greater than or equal to twice of that of the series resonator S1 before division, and has a capacitance of greater than or equal to 0.5Cs. Therefore, the magnitude of the spurious can be made approximately equal to or smaller than that of the comparative example.

A description will now be given of a case where the resonators S1 through S4 and P1 through P4 are piezoelectric thin film resonators having dispersion characteristics of frequency increasing type. As described in FIG. 23A, when the piezoelectric thin film resonator is of frequency increasing type, the parallel resonator greatly affects spurious.

As presented in the third and fourth columns in Table 1, the parallel resonator P1 at the first stage has a maximum degree of reduction of 41% and a minimum capacitance of 0.82 Cp in the parallel resonators P1 through P4. A minimum capacitance is Cp in the capacitances of the parallel resonators P1 through P4 of the comparative example. As described above, the minimum capacitance of 0.82 Cp in the present simulation is approximately 80% of Cp. Therefore, the magnitude of the spurious becomes approximately equal to that of the comparative example.

A description will now be given of calculation results of reflection characteristics of the reception filter. Smith charts illustrated in FIG. 28A, FIG. 29A and FIG. 30A are the same as those illustrated in FIG. 10A, FIG. 11A, and FIG. 12A respectively, but presented again for comparison.

Figure 28A:
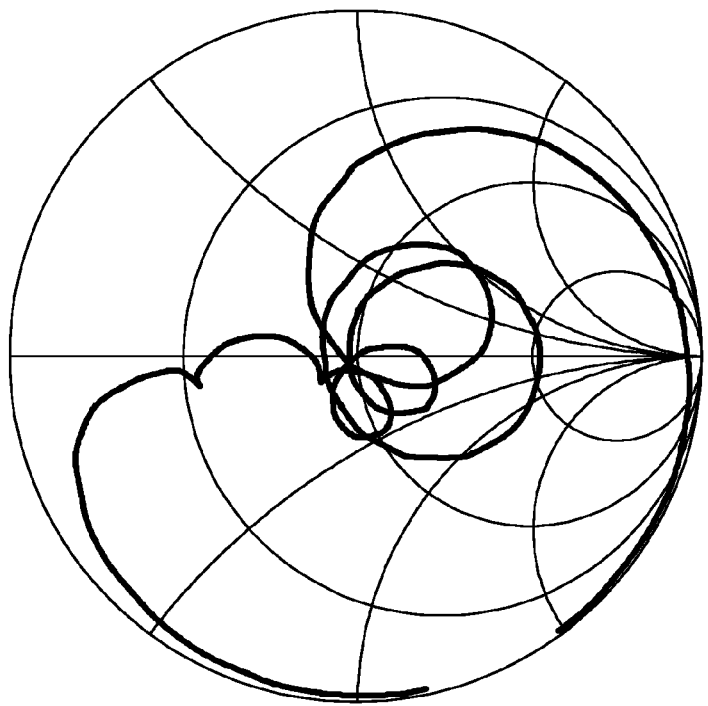
FIG. 28A is a Smith chart illustrating calculation results of the reflection characteristics of the reception filter included in the duplexer of the comparative example.
Figure 28B:
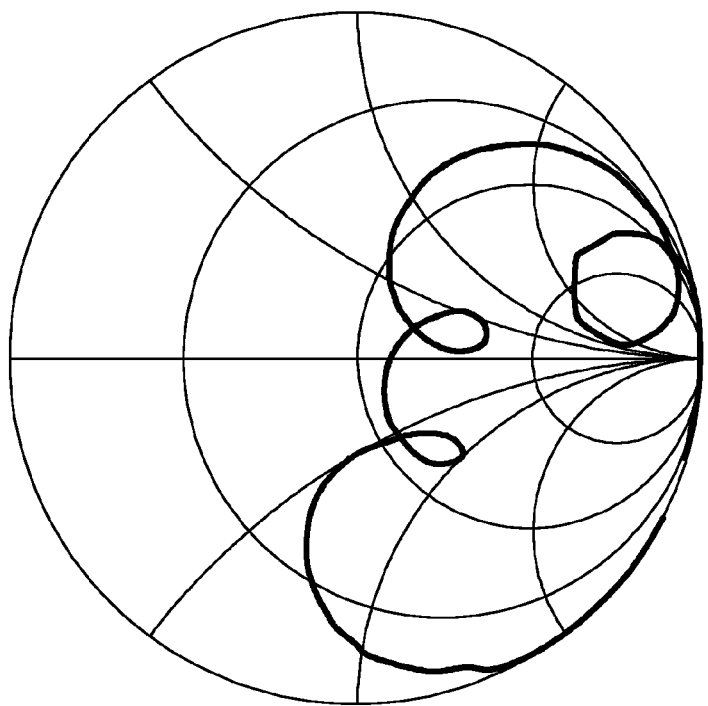
FIG. 28B is a Smith chart illustrating calculation results of the reflection characteristics of the reception filter at which phase rotation is performed.
Figure 29A:
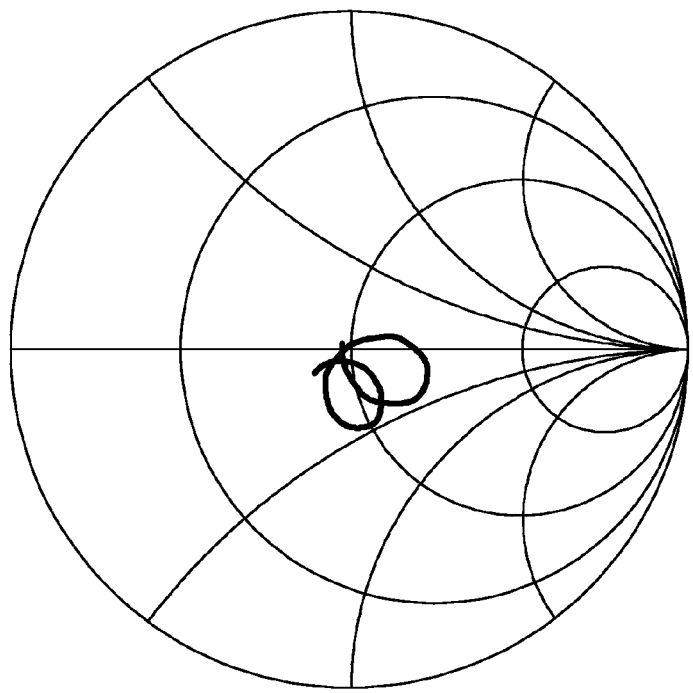
FIG. 29A is a Smith chart illustrating calculation results of the reflection characteristics of the reception filter included in the duplexer of the comparative example in the passband of the reception filter.
Figure 29B:
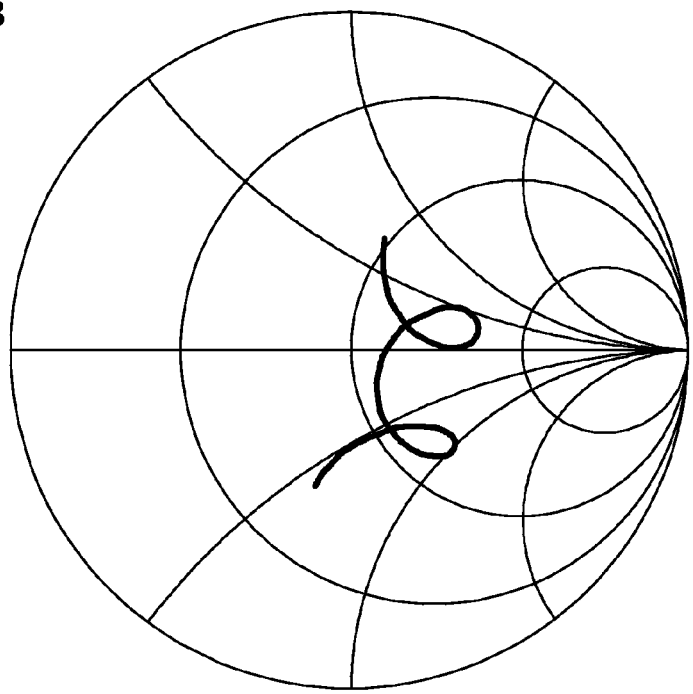
FIG. 29B is a Smith chart illustrating calculation results of the reflection characteristics of the reception filter at which the phase rotation is performed in the passband of the reception filter.

Compared to the comparative example illustrated in FIG. 28A, the phase of reflection characteristics of the reception filter illustrated in FIG. 28B is rotated. As illustrated in FIG. 29A and FIG. 29B, the reflection characteristics of the reception filter in the passband of the reception filter are located near the center of the Smith chart both in the comparative example and the case where the phase rotation is performed. That is to say, the impedance of the reception filter is matched at 50Ω in the passband of the reception filter. As described above, degradation of characteristics of the reception filter in the passband of the reception filter is suppressed even when the phase rotation is performed.

Figure 30A:
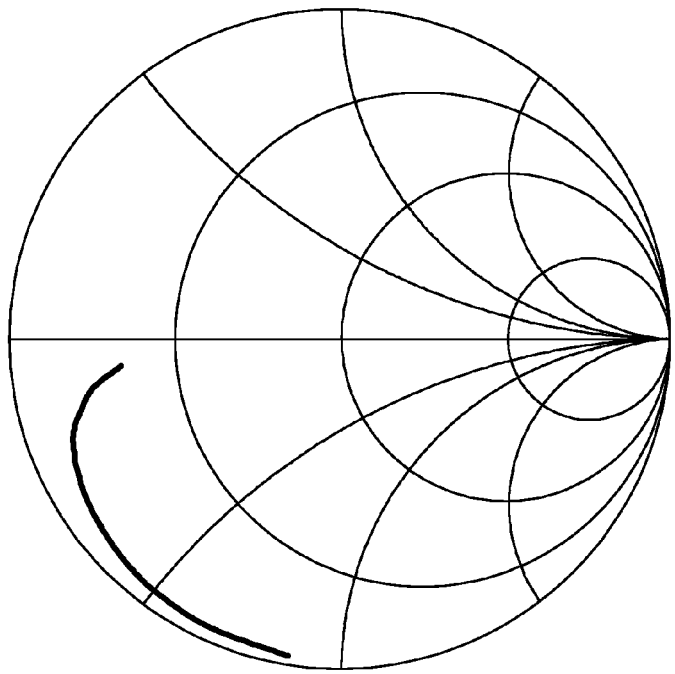
FIG. 30A is a Smith chart illustrating calculation results of the reflection characteristics of the reception filter included in the duplexer of the comparative example in the passband of the transmission filter.

As illustrated in FIG. 30A, the reflection characteristics is located near the left edge of the Smith chart in the comparative example. As indicated with the dotted line in FIG. 30B, the reflection characteristics are not located near the left edge of the Smith chart but located near the right edge because of the phase rotation. That is to say, the phase rotation increases the impedance of the reception filter in the passband of the transmission filter from around 0Ω to around infinity.

Next, considered is the case where the parallel resonator P1 is located at the first stage. A description will first be given of calculation results of capacitances. Table 2 lists calculation results of capacitances of the resonators in the ladder-type filter having the parallel resonator P1 for the resonator at the first stage as viewed from the antenna terminal Ant side (see dashed line in the table).

TABLE 2

| RESONATOR | CAPACITANCE COMPARATIVE IN EXAMPLE | DEGREE OF REDUCTION (%) | CAPACITANCE WHEN PHASE ROTATION IS PERFORMED |
|---|---|---|---|
| S1 | 0.5 Cs | 52 | 0.26 Cs |
| S2 | 0.5 Cs | 76 | 0.38 Cs |
| S3 | 0.5 Cs | 84 | 0.47 Cs |
| S4 | Cs | 51 | 0.51 Cs |
| P1 | Cp | 17 | 0.17 Cp |
| P2 | 2 Cp | 95 | 1.9 Cp |
| P3 | 2 Cp | 90 | 1.8 Cp |
| P4 | 2 Cp | 75 | 1.5 Cp |

As presented in Table 2, when the parallel resonator P1 is located at the first stage, the capacitance of the series resonator S1 is reduced by 52% from that of the comparative example, and becomes 0.26Cs. The capacitance of the series resonator S2 is reduced by 76%, and becomes 0.38Cs. The capacitance of the series resonator S3 is reduced by 84%, and becomes 0.47Cs. The capacitance of the series resonator S4 is reduced by 51%, and becomes 0.51Cs. The capacitance of the parallel resonator P1 is reduced by 17%, and becomes 0.17 Cp. The capacitance of the parallel resonator P2 is reduced by 95%, and becomes 1.9 Cp. The capacitance of the parallel resonator P3 is reduced by 90%, and becomes 1.8 Cp. The capacitance of the parallel resonator P4 is reduced by 75%, and becomes 1.5 Cp. The impedance of the reception filter can be increased by making the resonators have capacitances presented in Table 2.

A description will now be given of the suppression of spurious. A description will first be given of a case where the resonators S1 through S4 and P1 through P4 are piezoelectric thin film resonators having dispersion characteristics of frequency decreasing type.

As presented in the fourth columns in Table 2, when the phase rotation is performed, the series resonator S1 at the first stage has a minimum capacitance of 0.26Cs in the series resonators S1 through S4. Therefore, spurious can be suppressed by making the capacitance of the series resonator S1 large, i.e. by making the area of the resonance region of the series resonator S1 large. For example, the series resonator S1 is divided into two as with the case presented in Table 1. One of the series resonators formed by division has a resonance region with an area greater than or larger than twice of that of the series resonator S1 before division, and has a capacitance of greater than or equal to 0.5Cs. Therefore, the magnitude of the spurious can be made approximately equal to or smaller than that of the comparative example.

A description will now be given of a case where the resonators S1 through S4 and P1 through P4 are piezoelectric thin film resonators having dispersion characteristics of frequency increasing type. As described in FIG. 23A, when the piezoelectric thin film resonator has dispersion characteristics of frequency increasing type, the parallel resonator greatly affects spurious.

As presented in the third and fourth columns in Table 2, the parallel resonator P1 at the first stage has a maximum degree of reduction of 17%, and a minimum capacitance of 0.17 Cp in the parallel resonators P1 through P4. The minimum capacitance is Cp among the capacitances of the parallel resonators P1 through P4 in the comparative example. Therefore, the parallel resonators having capacitances approximately equal to Cp can be formed by dividing the parallel resonator P1 into, for example, six. This makes the magnitude of spurious approximately equal to that of the comparative example. However, the filter grows in size as the number of division increases.

A description will now be given of calculation results of reflection characteristics of the reception filter. Smith charts presented in FIG. 31A, FIG. 32A and FIG. 33A are the same as those presented in FIG. 10B, FIG. 11B and FIG. 12B respectively, but presented again for comparison.

Figure 31A:
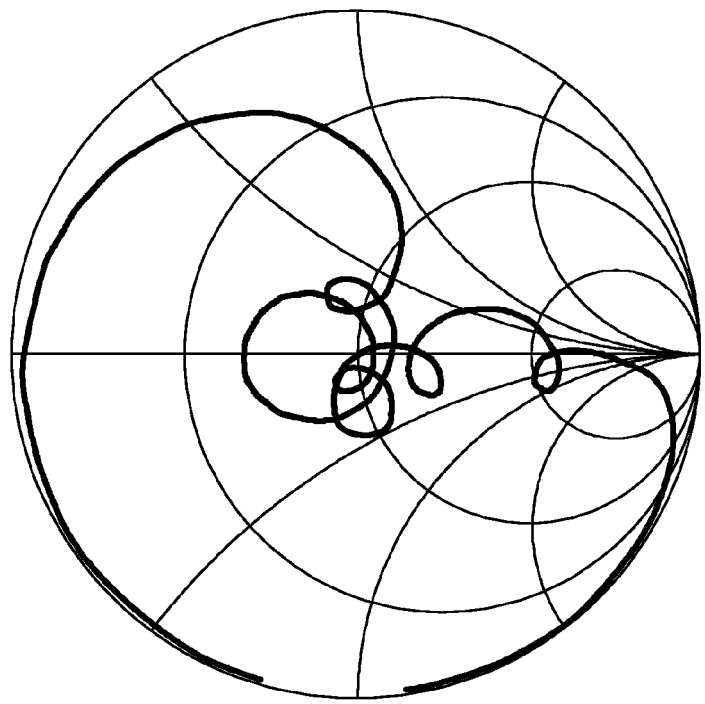
FIG. 31A is a Smith chart illustrating calculation results of the reflection characteristics of the reception filter included in the duplexer of the comparative example.
Figure 31B:
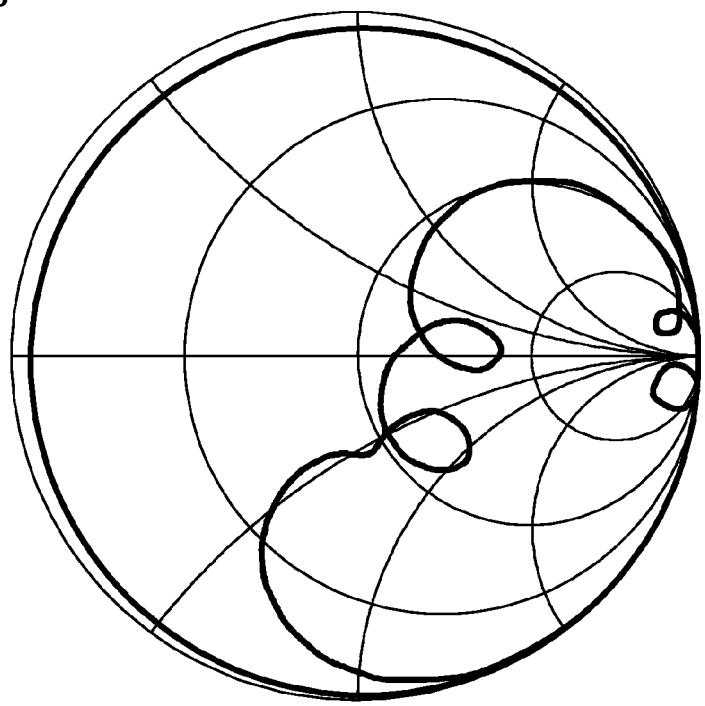
FIG. 31B is a Smith chart illustrating calculation results of the reflection characteristics of the reception filter at which the phase rotation is performed.
Figure 32A:
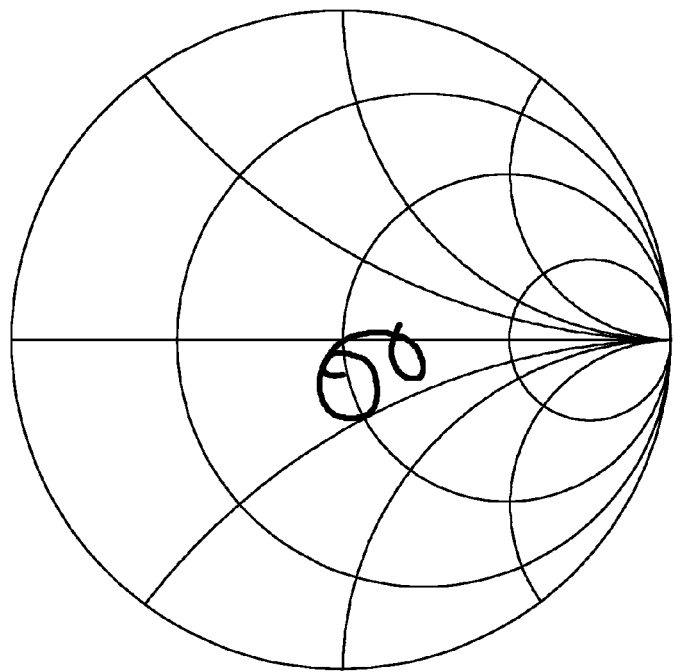
FIG. 32A is a Smith chart illustrating calculation results of the reflection characteristics of the reception filter included in the duplexer of the comparative example in the passband of the reception filter.
Figure 32B:
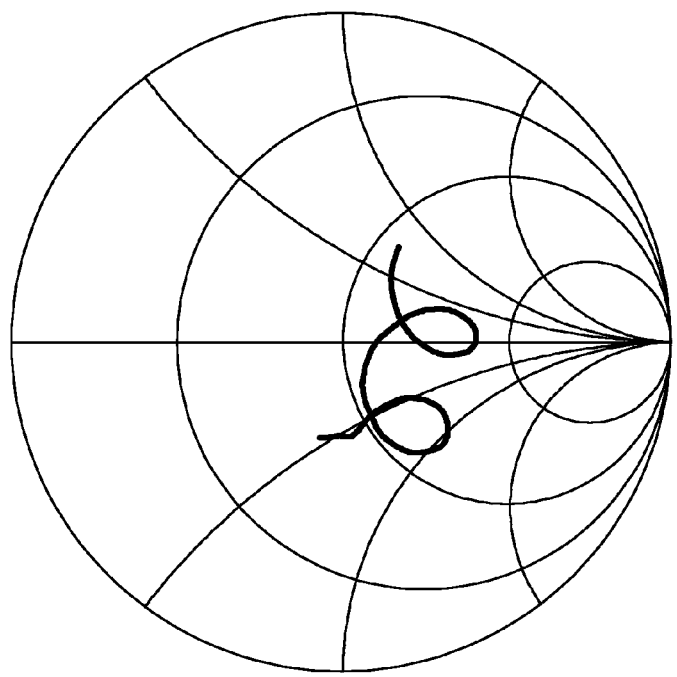
FIG. 32B is a Smith chart illustrating calculation results of the reflection characteristics of the reception filter at which the phase rotation is performed in the passband of the reception filter.

Compared to the comparative example illustrated in FIG. 31A, the phase of reflection characteristics of the reception filter illustrated in FIG. 31B is rotated. As illustrated in FIG. 32A and FIG. 32B, the reflection characteristics of the reception filter in the passband of the reception filter is located near the center of the Smith chart both in the comparative example and in the case where the phase rotation is performed. That is to say, the impedance of the reception filter in the passband of the reception filter is matched at 50Ω even when the phase rotation is performed.

Figure 33A:
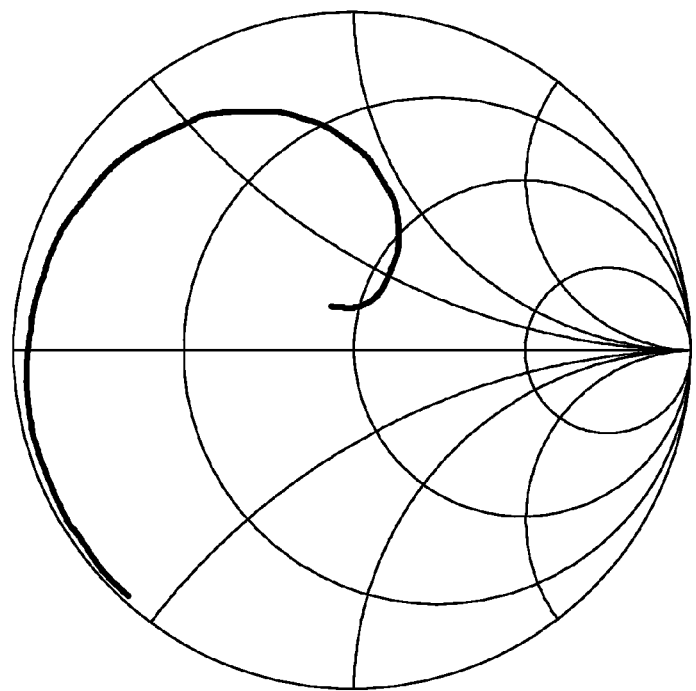
FIG. 33A is a Smith chart illustrating calculation results of the reflection characteristic of the reception filter included in the duplexer of the comparative example in the passband of the transmission filter.
Figure 33B:
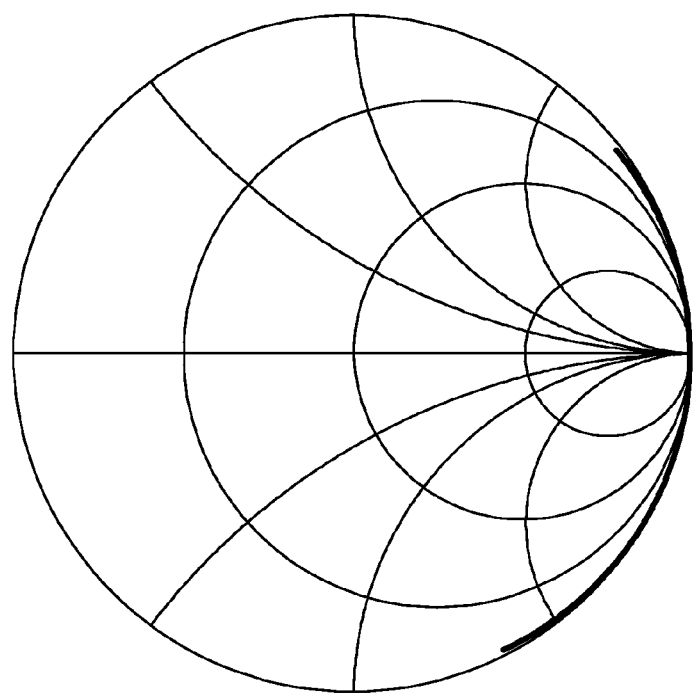
FIG. 33B is a Smith chart illustrating calculation results of the reflection characteristic of the reception filter at which the phase rotation is performed in the passband of the transmission filter.

As illustrated in FIG. 33A, the reflection characteristics is located near the left edge of the Smith chart in the comparative example. As illustrated in FIG. 33B, the reflection characteristics is not located near the left edge of the Smith chart, but located near the right edge because of the phase rotation. That is to say, the phase rotation increases the impedance of the reception filter in the passband of the transmission filter from around 0Ω to around infinity.

When the piezoelectric thin film resonator having dispersion characteristics of frequency decreasing type is used, the series resonator having a larger capacitance can reduce spurious. As presented in Table 2, when the resonator at the first stage is the parallel resonator P1, the degree of reduction of the series resonator S1 is 52%. As presented in Table 1, when the resonator at the first stage is the series resonator S1, the degree of reduction of the series resonator S1 is 25%. When the piezoelectric thin film resonator having dispersion characteristics of frequency decreasing type is used, the parallel resonator P1 is preferably used for the resonator at the first stage because this makes the degree of reduction of the series resonator S1 larger. In addition, series resonators having capacitances approximately equal to or more than that of the series resonator S1 of the comparative example are formed by serially dividing the series resonator S1 into two or more. Therefore, dividing the series resonator S1 is more preferable.

When the piezoelectric thin film resonator having dispersion characteristics of frequency increasing type is used, the parallel resonator having a larger capacitance can reduce spurious. As presented in Table 1, when the resonator at the first stage is the series resonator S1, the degree of reduction of the parallel resonator P1 is 41%. As presented in Table 2, when the resonator at the first stage is the parallel resonator P1, the degree of reduction of the parallel resonator P1 is 17%. When the piezoelectric thin film resonator having dispersion characteristics of frequency increasing type is used, the series resonator S1 is preferably used for the resonator at the first stage because this makes the degree of reduction of the parallel resonator P1 larger.

First Embodiment

Figure 34A:
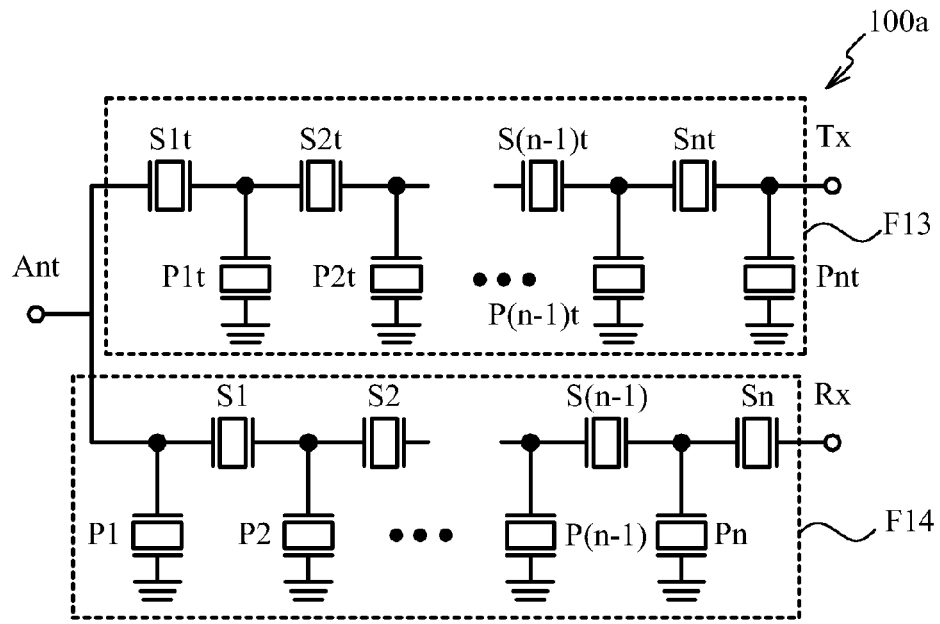
FIG. 34A is a circuit diagram illustrating a duplexer in accordance with a first embodiment.

A description will now be given of embodiments of the present invention based on the above discussion. A first embodiment describes a case where a piezoelectric thin film resonator has dispersion characteristics of frequency decreasing type. FIG. 34A is a circuit diagram illustrating a duplexer in accordance with the first embodiment.

As illustrated in FIG. 34A, a duplexer 100a of the first embodiment includes a transmission filter F13 (first filter), a reception filter F14 (second filter), an antenna terminal Ant (common terminal), a transmission terminal Tx (first terminal), and a reception terminal Rx (second terminal). A first end of the transmission filter F13 is connected to the antenna terminal Ant, and a second end is connected to the transmission terminal Tx. A first end of the reception filter F14 is connected to the antenna terminal Ant, and a second end is connected to the reception terminal Rx. The transmission filter F13 and the reception filter F14 are interconnected via the antenna terminal Ant. A phase shifter is located neither between the transmission filter F13 and the antenna terminal Ant, nor between the reception filter F14 and the antenna terminal Ant. The duplexer 100a is a duplexer supporting W-CDMA Band 2 for example. The transmission filter and the reception filter are n-stage ladder-type filters. The number of stages n affects the degree of suppression of the filter, but does not affect the phase of reflection characteristics. Therefore, the number of stages n can be determined arbitrarily. For example, when n is seven, the filter is the seven-stage ladder-type filter illustrated in FIG. 5B. The transmission filter F13 includes series resonators S1t through Snt and parallel resonators P1t through Pnt. The reception filter F14 includes series resonators S1 through Sn and parallel resonators P1 through Pn. The resonator at the first stage as viewed from the antenna terminal Ant is the parallel resonator P1 in the reception filter F14. Each resonator is a piezoelectric thin film resonator, and has dispersion characteristics of frequency decreasing type.

The first embodiment allows the impedance of the reception filter F14 in the passband of the transmission filter to be increased without using a phase shifter by adjusting the capacitance of the piezoelectric thin film resonator (see FIG. 33B and Table 2). Therefore, the loss of signal due to a phase shifter can be prevented, and the duplexer can be downsized. In addition, as described in Table 1 and Table 2, the degree of reduction of the series resonator S1 can be made small by using the parallel resonator P1 for the resonator at the first stage compared to by using the series resonator S1 for the resonator at the first stage. Therefore, the spurious occurring in the series resonator can be suppressed, and a ripple due to the spurious can be suppressed. That is to say, the first embodiment can increase the impedance of the reception filter F14 and suppress the spurious occurring in reflection characteristics when the piezoelectric thin film resonator has dispersion characteristics of frequency decreasing type. The suppression of spurious enables to suppress the ripple due to the spurious.

The duplexer 100a may support other communication methods instead of W-CDMA Band 2. In addition, as illustrated in FIG. 13 through FIG. 16, in W-CDMA Band 2, when the guard band width is less than or equal to 40 MHz, the impedance of the reception filter in the band of the transmission filter decreases significantly. Therefore, the characteristics of the duplexer can be improved effectively by making the duplexer 100a support W-CDMA Band 2 and making the gap between the passband of the transmission filter F13 and the passband of the reception filter F14 equal to 40 MHz. Furthermore, when the guard band width is 30 MHz or 20 MHz, characteristics of the duplexer can be improved more effectively. In particular, when the guard band width is less than 30 MHz, reflection characteristics is located near the left edge of the Smith chart (see FIG. 15B). That is to say, the impedance fairly comes close to 0Ω. Therefore, when the guard band width is less than or equal to 30 MHz, characteristics of the duplexer can be improved more effectively. The transmission filter F13 may have a structure different from that illustrated in FIG. 34A. For example, the resonator at the first stage as viewed from the antenna terminal Ant side may be the parallel resonator P1t.

To suppress the reflection of the signal between the stages in the reception filter F14, the impedances of the resonators preferably ascend from the reception terminal Rx side toward the antenna terminal Ant side. The piezoelectric thin film resonators included in the transmission filter F13 and the reception filter F15 may be any one of the resonators illustrated in FIG. 19B through FIG. 20C. However, each piezoelectric thin film resonator has dispersion characteristics of frequency decreasing type.

Figure 34B:
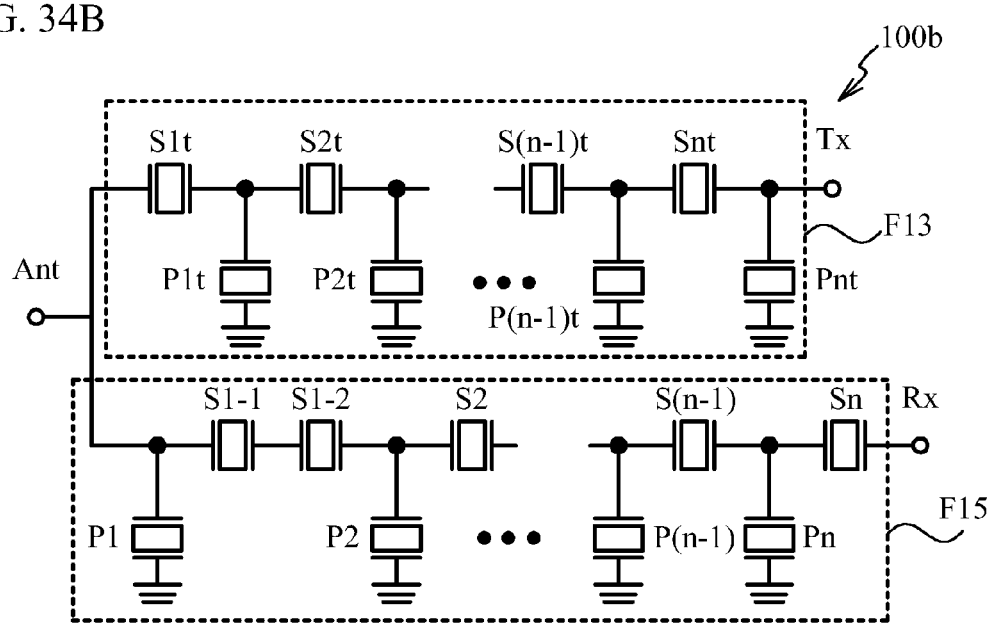
FIG. 34B is a circuit diagram illustrating a duplexer in accordance with a first variation of the first embodiment.

A description will now be given of a first variation of the first embodiment. The first variation of the first embodiment divides a series resonator into multiple resonators. FIG. 34B is a circuit diagram illustrating a duplexer in accordance with the first variation of the first embodiment. A description of components same as those already described in FIG. 34A is omitted.

The reception filter F15 is an n-stage ladder-type filter including series resonators S1-1 through Sn, and the parallel resonators P1 through Pn. The resonator at the first stage as viewed from the antenna terminal Ant side is the parallel resonator P1 in the reception filter F14. In addition, the reception filter F15 is a filter that has an impedance made to be close to infinity in the passband of the transmission filter by phase rotation at the reception filter in accordance with the comparative example. That is to say, the reception filter F15 corresponds to the case presented in Table 2.

The series resonators S1-1 and S1-2 are formed by serially dividing the series resonator S1 illustrated in FIG. 34A into two. A parallel resonator is not connected between the series resonator S1-1 (first series resonator) and the series resonator S1-2 (second series resonator). The series resonators S1-1 through Sn and the parallel resonators P1 through Pn have dispersion characteristics of frequency decreasing type.

The series resonator at the first stage as viewed from the antenna terminal Ant side is a series resonator serially divided into the S1-1 and S1-2 in the reception filter F15. Therefore, one of the series resonators S1-1 and S1-2 has a capacitance equal to or greater than twice of the combined capacitance of the series resonators S1-1 and S1-2. The increase in capacitance means the increase in area of the resonance region of the piezoelectric thin film resonator. Spurious can be suppressed by making the area of the resonance region of the piezoelectric thin film resonator large (see FIG. 24A through FIG. 27). In addition, the combined capacitance of the series resonators S1-1 and S1-2 is set to a capacitance that allows the impedance of the reception filter F15 to increase in the passband of the transmission filter (see FIG. 33B and Table 2). As described above, the first variation of the first embodiment enables to increase the impedance of the reception filter F15 and suppress spurious when the piezoelectric thin film resonator has dispersion characteristics of frequency decreasing type.

The first variation of the first embodiment enables to increase the impedance of the reception filter F15 in the passband of the transmission filter without using a phase shifter (see FIG. 33B and Table 2). The loss of signal can be reduced because a phase shifter is not used. In this case, as presented in Table 2, the capacitance of the series resonator S1 is reduced by 52% from that of the comparative example. The first variation of the first embodiment divides the series resonator S1 to form the series resonators S1-1 and S1-2. This increases areas of the resonance regions of the series resonators S1-1 and S1-2, and allows one of the series resonators S1-1 and S1-2 to have a capacitance greater than or approximately equal to the capacitance of the series resonator S1 in the comparative example. Therefore, spurious of reflection characteristics, and a ripple due to the spurious can be suppressed effectively. Therefore, the series resonator S1 is preferably serially divided.

The series resonator at the first stage may be a series resonator serially divided into three or more. Increase in the number of division enables to form a series resonator having a large capacitance, and to suppress spurious more effectively. However, the reception filter F15 grows in size as the number of division increases. Therefore, the number of division is preferably a number capable of preventing the reception filter F15 from growing in size. For example, as illustrated in FIG. 34A, spurious can be suppressed and the reception filter F15 can be prevented from growing in size by dividing the series resonators into two to form the S1-1 and the S1-2.

The series resonators S1-1 and S1-2 may have the same capacitance, or different capacitances. When the series resonators S1-1 and S1-2 have the same capacitance, spurious may occur in a similar way in the series resonators S1-1 and S1-2, and enhance each other. On the other hand, when the series resonators S1-1 and S1-2 have different capacitances, spurious occurs in a different way in the series resonators S1-1 and S1-2, and cancel out each other. Therefore, to suppress spurious efficiently, the series resonators S1-1 and S1-2 preferably have different capacitances. In addition, to make spurious occur in a different way in the series resonators S1-1 and S1-2, the shape of the resonance region 130 (see FIG. 19B for example) in the series resonator S1-1 preferably differs from that in the series resonator S1-2. Even when the series resonator S1 (first series resonator) is divided into three or more, at least one of the series resonators (second series resonators) formed by division preferably has a capacitance different from a capacitance of at least one of the other series resonators. In addition, the shape of the resonance region 130 in at least one of the series resonators preferably differs from a shape of at least one of resonance regions of the other series resonators.

Figure 35A:
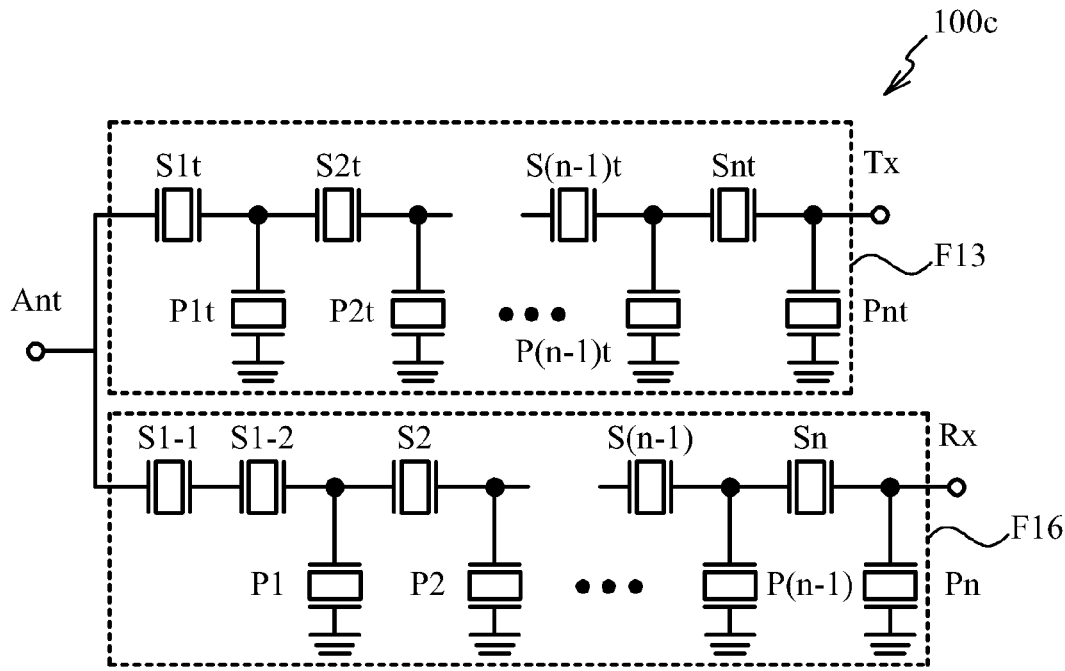
FIG. 35A is a circuit diagram illustrating a duplexer in accordance with a second variation of the first embodiment.

A description will now be given of a second variation of the first embodiment. The second variation of the first embodiment describes a case where the resonator at the first stage is a parallel resonator. FIG. 35A is a circuit diagram illustrating a duplexer in accordance with the second variation of the first embodiment. A description of components same as those already described in FIG. 34A and FIG. 34B is omitted.

As illustrated in FIG. 35A, the resonator at the first stage as viewed from the antenna terminal Ant side is the series resonator S1-1 in a reception filter F16. A parallel resonator is not connected between the series resonators S1-1 and S1-2.

The second variation of the first embodiment enables to increase the impedance of the reception filter F16 in the passband of the transmission filter and to suppress spurious when the piezoelectric thin film resonator has dispersion characteristics of frequency decreasing type.

Figure 30B:
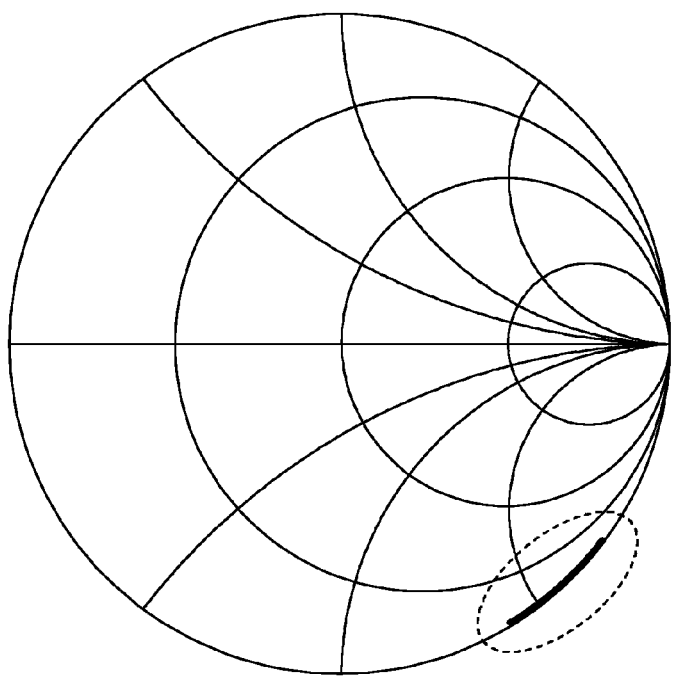
FIG. 30B is a Smith chart illustrating calculation results of the reflection characteristics of the reception filter at which the phase rotation is performed in the passband of the transmission filter.

That is to say, the second variation of the first embodiment enables to increase the impedance of the reception filter F16 in the passband of the transmission filter without using a phase shifter (see FIG. 30B and Table 1). The loss of signal can be reduced because a phase shifter is not used. In this case, as presented in Table 1, the capacitance of the series resonator S1 is reduced by 25% from that of the comparative example. The reduction in capacitance may increase spurious. The second variation of the first embodiment serially divides the series resonator S1 to form the series resonators S1-1 and S1-2. This increases the areas of the resonance regions of the series resonators S1-1 and S1-2, and allows the series resonator S1-1 or S1-2 to have a capacitance approximately equal to or greater than the capacitance of the series resonator S1 in the comparative example. Therefore, spurious of reflection characteristics, and a ripple due to the spurious can be suppressed effectively. Therefore, the series resonator S1 is preferably serially divided.

Second Embodiment

Figure 35B:
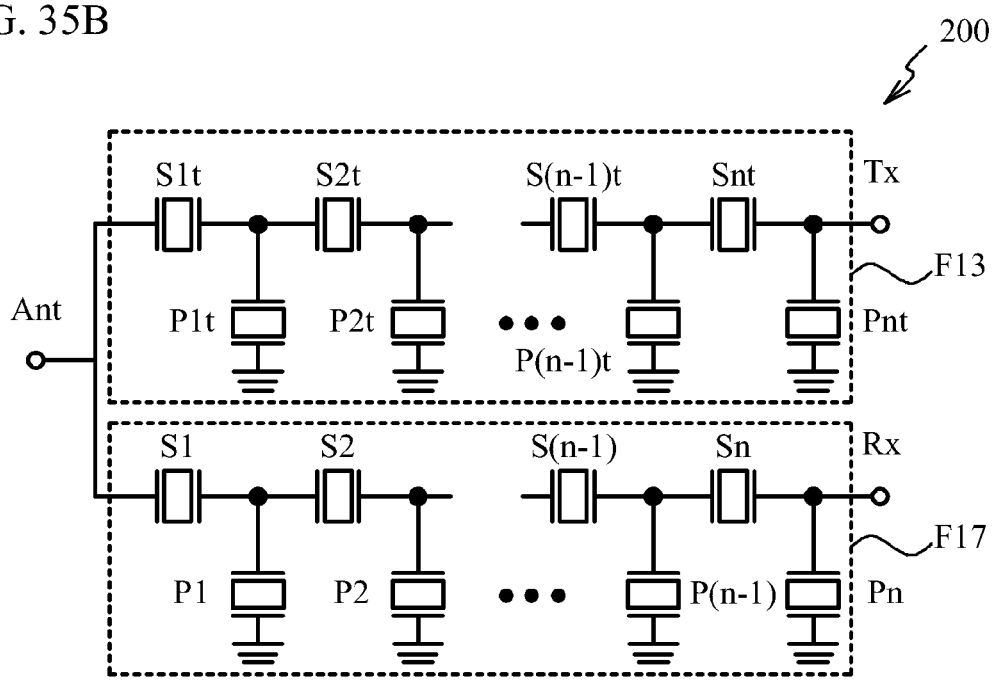
FIG. 35B is a circuit diagram illustrating a duplexer in accordance with a second embodiment.

A second embodiment describes a case where the piezoelectric thin film resonator has dispersion characteristics of frequency increasing type. FIG. 35B is a circuit diagram illustrating a duplexer in accordance with the second embodiment. A description of components same as those already described in FIG. 34A through FIG. 35B is omitted.

As illustrated in FIG. 35B, a reception filter F17 is an n-stage ladder-type filter including the series resonators S1 through Sn and the parallel resonators P1 through Pn. A resonator at the first stage as viewed from the antenna terminal Ant side is the series resonator S1 in the reception filter F17. In addition, the reception filter F17 is a filter that makes the impedance of the reception filter F17 close to infinity in the passband of the transmission filter by performing the phase rotation at the reception filter of the comparative example. That is to say, the reception filter F17 corresponds to the case presented in Table 1. The series resonators S1 through Sn and the parallel resonators P1 through Pn have dispersion characteristics of frequency increasing type.

The second embodiment enables to increase the impedance of the reception filter F17 in the passband of the transmission filter without using a phase shifter (see FIG. 30B and Table 1). As described in Table 1, the degree of reduction of the parallel resonator P1 is 41%, and the capacitance of the parallel resonator P1 is 0.82 Cp which is approximately 80% of the minimum capacitance of the comparative example that does not perform the phase rotation. Therefore, even when the phase rotation is performed, a significant increase in spurious is suppressed. That is to say, the second embodiment enables to increase the impedance of the reception filter F17 and to suppress spurious when the piezoelectric thin film resonator has dispersion characteristics of frequency decreasing type. Furthermore, the loss of signal due to a phase shifter is suppressed because the phase shifter is not used. This enables to improve characteristics of a duplexer 200.

Even when the piezoelectric thin film resonator has dispersion characteristics of frequency increasing type, the reception filter using the parallel resonator P1 for the resonator at the first stage as illustrated in FIG. 34B may be used. However, as presented in Table 2, when the resonator at the first stage is the parallel resonator P1, the degree of reduction in capacitance of the parallel resonator P1 is 17%, and the capacitance of the parallel resonator P1 becomes small. Decrease in capacitance is unfavorable for the suppression of spurious. To suppress spurious, the parallel resonator P1 may be divided into, for example, six. However, increase in the number of division may cause the reception filter to grow in size. Therefore, to suppress spurious and prevent the reception filter from growing in size, the resonator at the first stage is preferably the series resonator S1.

Third Embodiment

Figure 36:
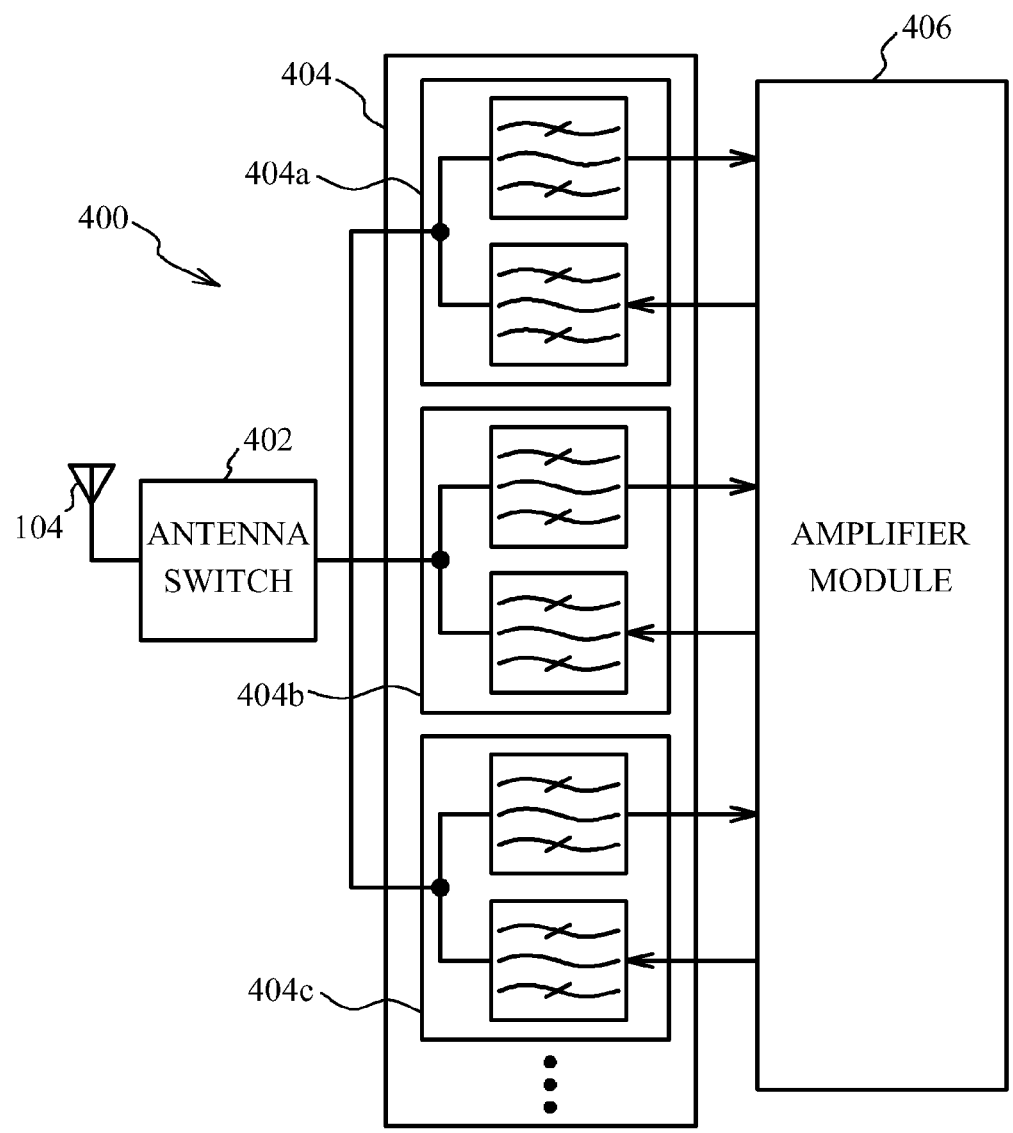
FIG. 36 is a block diagram illustrating an RF module in accordance with a third embodiment.

A third embodiment uses a duplexer in an RF (Radio Frequency) module. FIG. 36 is a block diagram illustrating an RF module in accordance with the third embodiment.

As illustrated in FIG. 36, an RF module 400 includes an antenna 104, an antenna switch 402, a duplexer bank 404, and an amplifier module 406. The RF module 400 is an RF module for, for example, mobile phones, and supports multiple communication methods such as GSM (Global System for Mobile Communication) communication method and W-CDMA communication method. For GSM, the RF module 400 supports 850 MHz band (GSM850), 900 MHz band (GSM900), 1800 MHz band (GSM1800), and 1900 MHz band (GSM1900). The antenna 104 receives both transmission and reception signals of GSM and W-CDMA.

The duplexer bank 404 includes duplexers 404a, 404b and 404c. The duplexers supports respective communication methods. The antenna switch 402 selects a duplexer, which supports the communication method with which signals are to be transmitted or received, from the duplexers included in the duplexer bank 404, and connects the selected duplexer to the antenna 104. The duplexers are connected to the amplifier module 406. The amplifier module 406 amplifies signals received by the reception filter of the duplexer, and outputs them to a processing unit. In addition, the amplifier module 406 amplifies signals generated by the processing unit, and outputs them to the transmission filter of the duplexer.

Each of the duplexers 404a through 404c may have the same structure as that of any one of the duplexers 100a through 200 (see FIG. 34A through FIG. 35), or two or one of the duplexers 404a through 404c may have the same structure as that of any one of the duplexers 100a through 200. That is to say, at least one of the duplexers 404a through 404c have the same structure as that of any one of the duplexers 100a through 200. The duplexer bank 404 may include two duplexers, or four or more duplexers. At least one of the duplexers included in the duplexer bank 404 has the same structure as that of any one of the duplexer 100a through 200.

As illustrated in FIG. 19B, FIG. 20A, or FIG. 20B, when the penetration hole 132, the cavity 134, or the space 136 is formed below the resonance region 130, dispersion characteristics of the piezoelectric thin film resonator mainly depend on a material of the piezoelectric thin film 128 included in the piezoelectric thin film resonator. When the piezoelectric thin film 128 is made of a material with a Poisson ratio of less than 0.3, the piezoelectric thin film resonator has dispersion characteristics of frequency decreasing type. Aluminum nitride (AlN) oriented in the (002) direction is an example of the material with a Poisson ratio of less than 0.3. In addition, when the piezoelectric thin film 128 is made of a material with a Poisson ratio of greater than or equal to 0.3, the piezoelectric thin film resonator has dispersion characteristics of frequency increasing type. Zinc oxide (ZnO) oriented in the (002) direction is an example of the material with a Poisson ratio of greater than or equal to 0.3. In addition, when the acoustic reflection film 138 is used as illustrated in FIG. 20C, not only the Poisson ratio of the piezoelectric thin film 128 but also the Poisson ratio of the acoustic reflection film 138 may affect dispersion characteristics of the piezoelectric thin film resonator.

Although the embodiments of the present invention have been described in detail, it should be understood that the various change, substitutions, and alterations could be made hereto without departing from the spirit and scope of the invention.

What is claimed is:

1. A duplexer comprising:
    a first filter of which a first end is coupled to a common terminal, and a second end is coupled to a first terminal; and
    a second filter having a passband higher than a passband of the first filter, a first end of the second filter being coupled to the common terminal, and a second end of the second filter being coupled to a second terminal, wherein
    a phase shifter is located neither between the first filter and the common terminal nor between the second filter and the common terminal,
    the second filter is a ladder-type filter including piezoelectric thin film resonators connected in a ladder shape,
    a propagation constant in a direction perpendicular to a thickness direction of a piezoelectric thin film included in each of the piezoelectric thin film resonators is a real number at frequencies lower than a resonance frequency of corresponding one of the piezoelectric thin film resonators,
    a resonator at a first stage as viewed from a side of the common terminal is a parallel resonator in the second filter, and
    the duplexer comprises no inductor of which a first end is connected to a node between the common terminal and at least one of the first filter and the second filter, and a second end is connected to a ground.

2. The duplexer according to claim 1, wherein
    the first filter is a transmission filter, and
    the second filter is a reception filter.

3. The duplexer according to claim 1, wherein
    a gap between the passband of the first filter and the passband of the second filter is less than or equal to 40 MHz.

4. The duplexer according to claim 1, wherein
    the duplexer is a duplexer supporting W-CDMA (Wideband Code Division Multiple Access) Band 2.

5. A duplexer comprising:
    a first filter of which a first end is coupled to a common terminal, and a second end is coupled to a first terminal; and
    a second filter having a passband higher than a passband of the first filter, a first end of the second filter being coupled to the common terminal, and a second end being coupled to a second terminal, wherein
    a phase shifter is located neither between the first filter and the common terminal nor between the second filter and the common terminal,
    the second filter is a ladder-type filter including piezoelectric thin film resonators connected in a ladder shape,
    a propagation constant in a direction perpendicular to a thickness direction of a piezoelectric thin film included in each of the piezoelectric thin film resonators is a real number at frequencies lower than a resonance frequency of corresponding one of the piezoelectric thin film resonators,
    a resonator at a first stage as viewed from a side of the common terminal is a parallel resonator in the second filter, and
    a first series resonator that is included in the second filter and is located closest to the common terminal is serially divided.

6. The duplexer according to claim 5, wherein
    at least one second series resonator of second series resonators formed by serially dividing the first series resonator has a capacitance different from a capacitance of at least one of the second series resonators other than the at least one second series resonator.

7. The duplexer according to claim 5, wherein
    a gap between the passband of the first filter and the passband of the second filter is less than or equal to 40 MHz.

8. The duplexer according to claim 5, wherein
    the duplexer is a duplexer supporting W-CDMA Band 2.

9. The duplexer according to claim 5, wherein
    the first filter is a transmission filter, and
    the second filter is a reception filter.

10. A duplexer comprising:
    a first filter of which a first end is coupled to a common terminal, and a second end is coupled to a first terminal; and a second filter having a passband higher than a passband of the first filter, a first end of the second filter being coupled to the common terminal, and a second end being coupled to a second terminal, wherein at least a part of a phase shifter is connected neither between the common terminal and a ground, between the first filter and the common terminal nor between the second filter and the common terminal, the second filter is a ladder-type filter including piezoelectric thin film resonators connected in a ladder shape, a propagation constant in a direction perpendicular to a thickness direction of a piezoelectric thin film of each of the piezoelectric thin film resonators is a real number at frequencies lower than a resonance frequency of corresponding one of the piezoelectric thin film resonators, a resonator at a first stage as viewed from a side of the common terminal is a first series resonator in the second filter, and the first series resonator is serially divided.

11. The duplexer according to claim 10, wherein
at least one second series resonator of second series resonators formed by serially dividing the first series resonator has a capacitance different from a capacitance of at least one of the second series resonators other than the at least one second series resonator.

12. The duplexer according to claim 10, wherein
a region, in which an upper electrode and a lower electrode overlap each other across the piezoelectric thin film, of at least one second series resonator of second series resonators formed by serially dividing the first series resonator has a shape different from that of at least one of the second series resonators other than the at least one second series resonator.

13. The duplexer according to claim 10, wherein
the first filter is a transmission filter, and
the second filter is a reception filter.

14. The duplexer according to claim 10, wherein
a gap between the passband of the first filter and the passband of the second filter is less than or equal to 40 MHz.

15. The duplexer according to claim 10, wherein
the duplexer is a duplexer supporting W-CDMA Band 2.

16. A duplexer comprising:
a first filter of which a first end is coupled to a common terminal, and a second end is coupled to a first terminal; and
a second filter having a passband higher than a passband of the first filter, a first end of the second filter being coupled to the common terminal, and a second end being coupled to a second terminal, wherein
at least a part of a phase shifter is connected neither between the common terminal and a ground, between the first filter and the common terminal nor between the second filter and the common terminal;
the second filter is a ladder-type filter including piezoelectric thin film resonators connected in a ladder shape,
a propagation constant in a direction perpendicular to a thickness direction of a piezoelectric thin film included in each of the piezoelectric thin film resonators is a real number at frequencies higher than a resonance frequency of corresponding one of the piezoelectric thin film resonators, and
a resonator at a first stage as viewed from a side of the common terminal is a series resonator in the second filter.

17. The duplexer according to claim 16, wherein
the first filter is a transmission filter, and
the second filter is a reception filter.

* * * * *